United States Patent [19]
Oba

[11] Patent Number: 5,585,217
[45] Date of Patent: Dec. 17, 1996

[54] POLYAMIC ACID COMPOSITION

[75] Inventor: Masayuki Oba, Yokohama, Japan

[73] Assignee: Kabushiki Kaisha Toshiba, Kawasaki, Japan

[21] Appl. No.: 453,753

[22] Filed: May 30, 1995

Related U.S. Application Data

[63] Continuation of Ser. No. 202,137, Feb. 25, 1994, abandoned.

[30] Foreign Application Priority Data

| Feb. 26, 1993 | [JP] | Japan | 5-037225 |
| Sep. 10, 1993 | [JP] | Japan | 5-225297 |
| Sep. 20, 1993 | [JP] | Japan | 5-255247 |

[51] Int. Cl.[6] .................................. G03F 7/023
[52] U.S. Cl. .................. 430/191; 430/170; 430/192; 430/270.1
[58] Field of Search ..................... 430/191, 192, 430/270.1, 170

[56] References Cited

U.S. PATENT DOCUMENTS

| 4,927,736 | 5/1990 | Mueller et al. | 430/275 |
| 5,011,753 | 4/1991 | Mueller et al. | 430/192 |
| 5,037,720 | 8/1991 | Khanna | 430/190 |
| 5,182,183 | 1/1993 | Tomiyasu et al. | 430/191 |
| 5,238,784 | 8/1993 | Tokoh et al. | 430/192 |
| 5,342,739 | 8/1994 | Katou et al. | 430/192 |

*Primary Examiner*—Janet C. Baxter
*Assistant Examiner*—Christopher G. Young
*Attorney, Agent, or Firm*—Oblon, Spivak, McClelland, Maier & Neustadt, P.C.

[57] ABSTRACT

Disclosed herein is a polyamic acid composition which comprises an aromatic carboxylic acid compound having phenolic hydroxyl groups, polyamic acid, and a photosensitizer made of a diazide compound, and which can form a polyimide film pattern having a high resolution and capable of firmly adhering to a substrate.

8 Claims, 4 Drawing Sheets

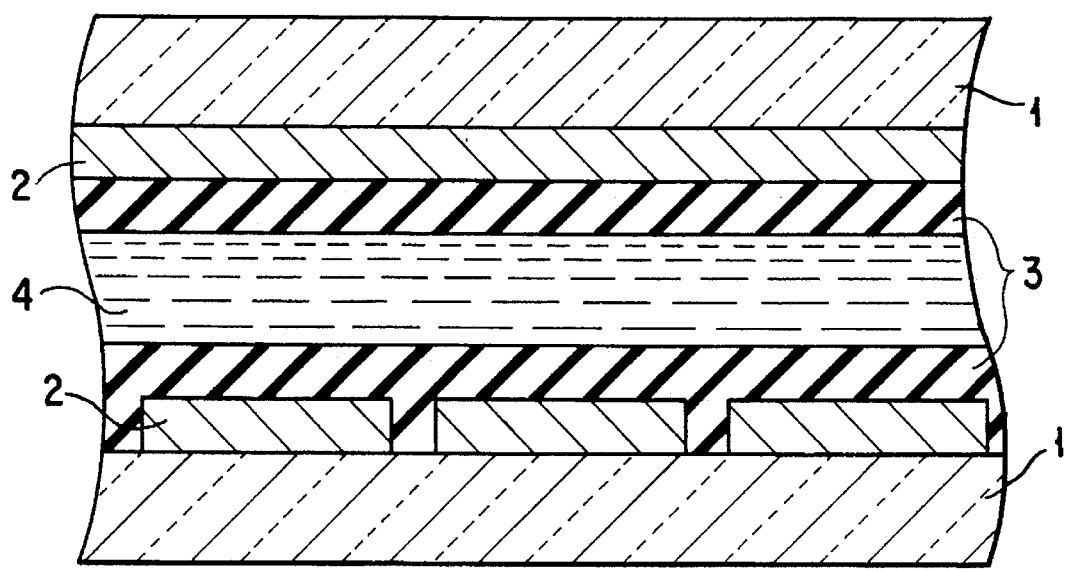
F I G. 1

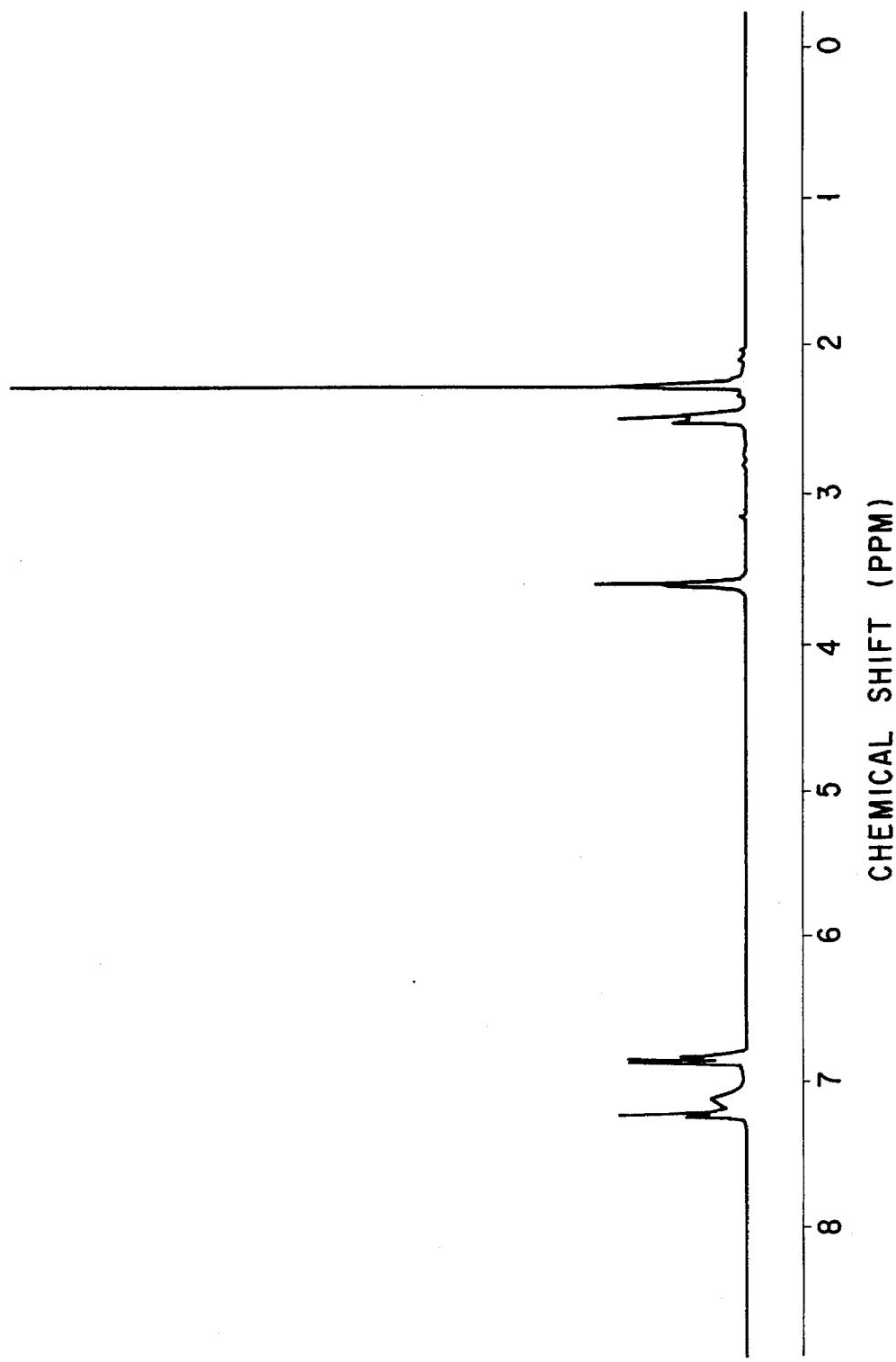

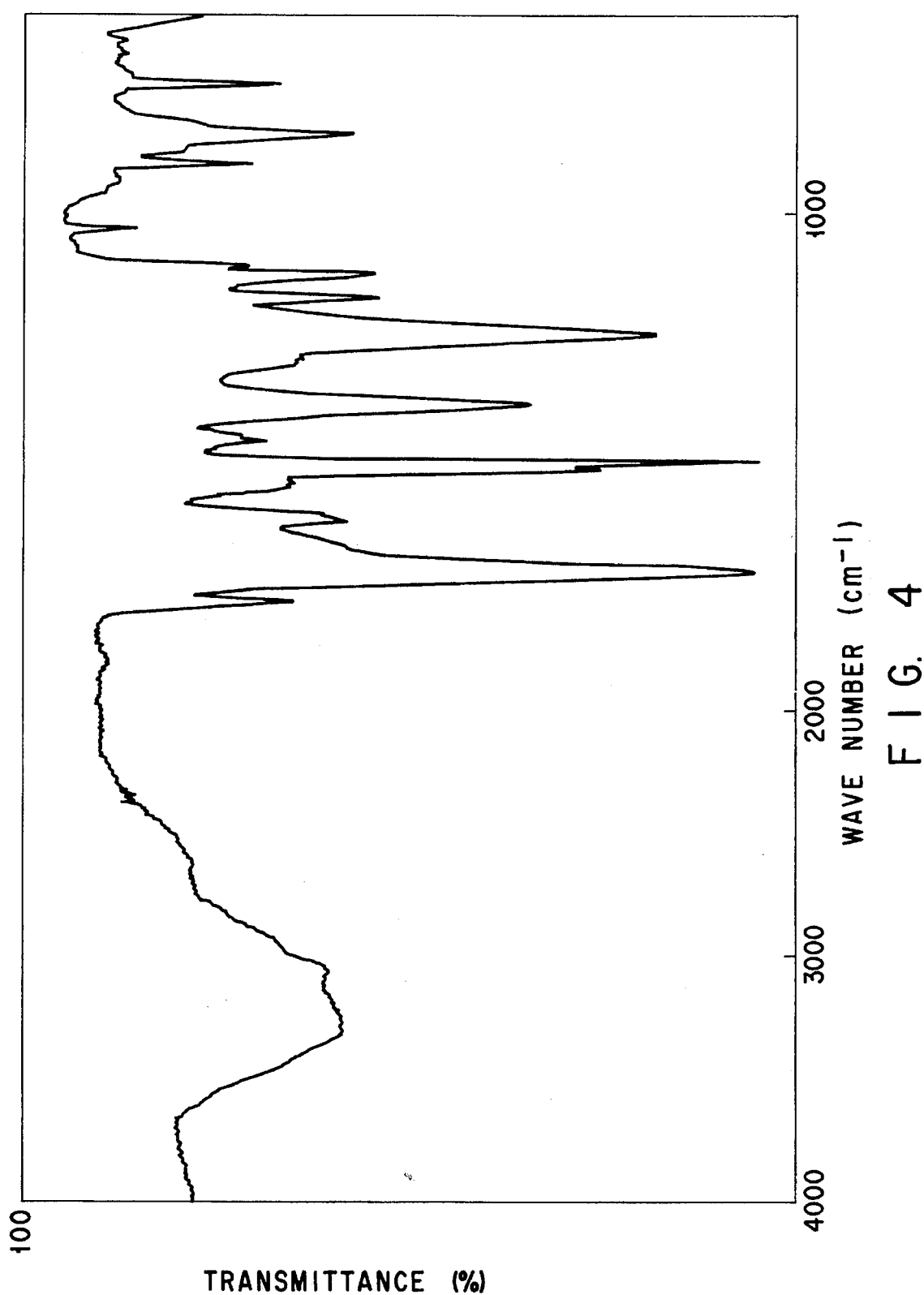

POLYAMIC ACID COMPOSITION

This application is a continuation of application Ser. No. 08/202,137, filed on Feb. 25, 1994, now abandoned.

BACKGROUND OF THE INVENTION

1. Field of the Invention

The present invention relates to a polyamic acid composition suitable for use in forming a polyimide film pattern by means of exposure and development, and to a polyamic acid composition which can be imidized at low temperatures.

2. Description of the Related Art

Polyimide resin has hitherto been used as material of liquid-crystal orientation film of a liquid crystal display and as material of insulating films and protective films of a semiconductor device.

In a semiconductor device, for example, a protective (i.e., passivation) film is formed on the semiconductor substrate, to protect the elements formed in the substrate, from the external environment and also to enhance the reliability of the semiconductor device. Used widely as material of the protective film is polyimide resin, which has high radiation resistance, high heat resistance, and excellent electrical properties such as insulating property. Polyimide resin is commonly used, also as material of interlayer insulating film of a multilayerd semiconductor device.

Such a polyimide resin film can easily be formed from polyamic acid which is a precursor of the polyimide resin. More specifically, a varnish of polyamic acid is coated on the surface of a substrate and dried, thus forming a film. The film, thus formed, is heated, thereby cyclizing the polyamic acid. As a result, the film is imidized into a polyimide resin film. Thereafter, the photolithography of the ordinary type is performed on the resin film, thereby forming a polyimide film pattern. This method of forming a polyimide film pattern can be performed with a stabilizing treatment at a relatively low temperature, and is therefore employed widely in the manufacture of semiconductor devices.

In recent years, attempts have been made to use a polyamic acid composition which can be applied as photoresist for forming patterns, in order to simplify the process of manufacturing semiconductor devices. For example, Jpn. Pat. Appln. KOKAI Publication 4-218051 discloses a method using a photosensitive polyamic acid composition that contains a polyamic acid derivative which has a repeating unit represented by the following formula (A) and having at side chains organic groups having hydroxyl groups directly bonded to an aromatic ring and a photosensitizer.

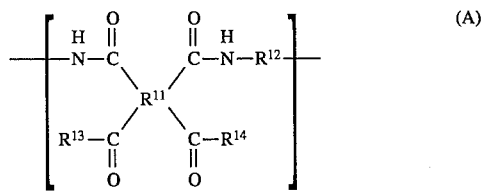

($R^{11}$ is a tetravalent organic group, $R^{12}$ is a divalent organic group, and $R^{13}$ and $R^{14}$ are each a monovalent organic group or a hydroxyl group, at least one of $R^{13}$ and $R^{14}$ being an organic group having a hydroxyl group directly bonded to an aromatic ring.)

The above-mentioned polyamic acid derivative can be synthesized by two methods. The first method comprises the steps of: forming polyamic acid through reaction between tetracarboxylic dianhydride and diamine compound; and making the polyamic acid to react with an alcohol compound, an amine compound or an alkoxy compound, each compound having a hydroxyl group directly bonded to an aromatic ring, in the presence of a dehydrating agent, thereby synthesizing a polyamic acid derivative. The second method comprises the steps of: causing tetracarboxylic dianhydride to react with an alcohol compound, an amine compound or an alkoxy compound, each compound having a hydroxyl group directly bonded to an aromatic ring, thereby forming a compound; and dehydrating and condensing diamine compound and the compound formed by the above reaction, thereby synthesizing a polyamic acid derivative. In either method, however, side reaction takes place during the dehydration, inevitably causing cyclization and, subsequently, gelation of some of the polymers. The polyamic acid composition becomes less soluble to a development solution. Consequently, the polyimide film pattern formed from the aforementioned polyamic acid composition has but an insufficient resolution. With the second method, in particular, it is difficult to obtain a polyamic acid derivative having a high molecular weight. Thus, a polyimide film pattern having a high degree of polymerization cannot be formed from the polyamic acid derivative prepared by the second method.

In an liquid crystal device it is required that the liquid crystal be oriented appropriately. The method, generally employed to form a film which properly orients liquid crystal, comprises the steps of: coating a varnish of polyamic acid on the ITO transparent electrodes formed on a transparent substrate; imidizing the varnish, thereby forming a polyimide film; and rubbing the polyimide film thus formed. This method, however, includes heat treatment conducted at 300° C. or more, which would discolor the color filters incorporated in a color liquid crystal display.

To prevent such discoloring of the color filters, a varnish of polyimide resin soluble in an organic solvent is coated directly on the surface of a substrate. However, the polyimide resin of this type will cause a problem when the technique of orienting liquid crystal in two different directions within each pixel, known as "dual domain technique," is applied in order to increase the view angle of the liquid crystal display. The dual domain technique is achieved by rubbing the polyimide film in one direction, forming photoresist to cover one half of each pixel, and rubbing the film in the other direction, while using the photoresist as a mask. The photoresist is formed to cover one half of every pixel, by means of exposure and development. When the photoresist is developed with a development solution, the polyimide film is immersed in the development solution which a mixture of a developing agent and an organic solvent. Made of polyimide resin soluble with an organic solvent, the film is damaged, ultimately reducing performance of the liquid crystal display.

As described above, the polyimide film pattern made from the conventional photosensitive polyamic acid composition has but an insufficient resolution. Furthermore, in the manufacture of a liquid crystal display or the like, the heat applied on the polyamic acid composition, imidizing the polyamic acid and forming a polyimide film to serve as a liquid-crystal orientation film, would inevitably affect the display characteristics of the liquid crystal display.

SUMMARY OF THE INVENTION

In view of the foregoing, the object of this invention is to provide a polyamic acid composition which can form a polyimide film pattern having a sufficient resolution and capable of adhering firmly to a substrate, and also to provide a polyamic acid composition which can be imidized at low temperatures.

According to a first aspect of the invention, there is provided a polyamic acid composition which comprises:

at least one component selected from the group consisting of compounds represented by the following formulas (1) to (5) and derivatives thereof:

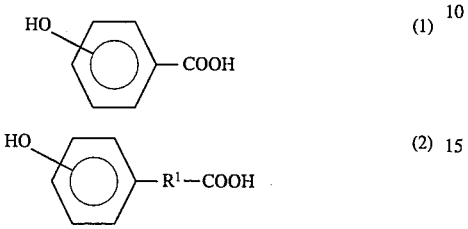

($R^1$ is an alkylene group having 1 to 10 carbon atoms, ethynylene group or —CH$_2$CO—.)

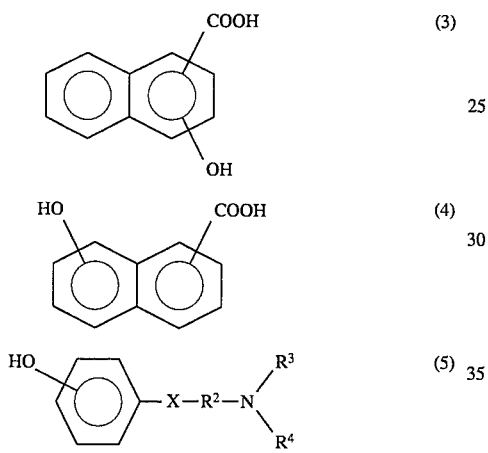

(X is —C(=O)—O— or —C(=O)—NH—, $R^2$ is an alkylene group having 1 to 4 carbon atoms, and $R^3$ and $R^4$ are each a methyl group or an ethyl group.);

polyamic acid represented by the following formula (11):

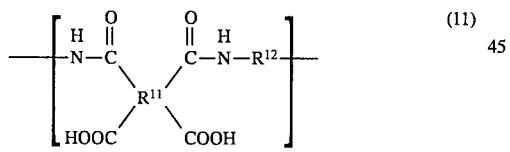

($R^{11}$ is a tetravalent organic group, and $R^{12}$ is a divalent organic group.); and a photosensitizer.

According to a second aspect of the invention, there is provided a polyamic acid composition which comprises:

at least one component selected from the group consisting of compounds represented by the following formulas (1) to (5) and derivatives thereof:

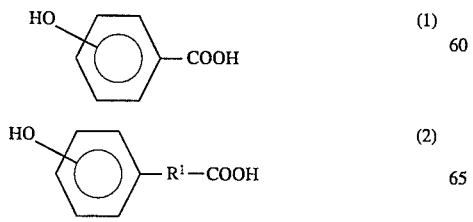

($R^1$ is an alkylene group having 1 to 10 carbon atoms, ethynylene group or —CH$_2$CO—.)

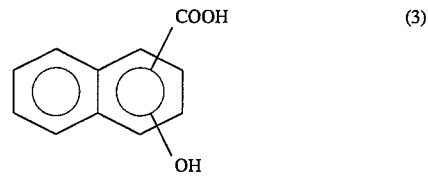

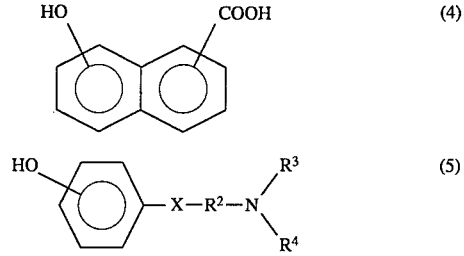

(X is —C(=O)—O— or —C(=O)—NH—, $R^2$ is an alkylene group having 1 to 4 carbon atoms, and $R^3$ and $R^4$ are each a methyl group or an ethyl group.);

polyamic acid represented by the following formula (11)

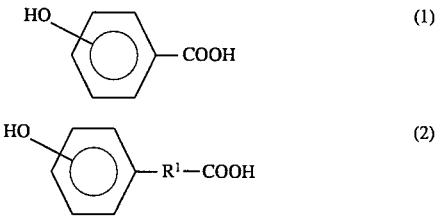

($R^{11}$ is a tetravalent organic group, and $R^{12}$ is a divalent organic group.);

a dissolution inhibitor; and a compound capable of generating an acid when irradiated with light.

According to a third aspect of the invention, there is provided a polyamic acid composition which comprises:

at least one component selected from the group consisting of compounds represented by the following formulas (1) to (10) and derivatives thereof:

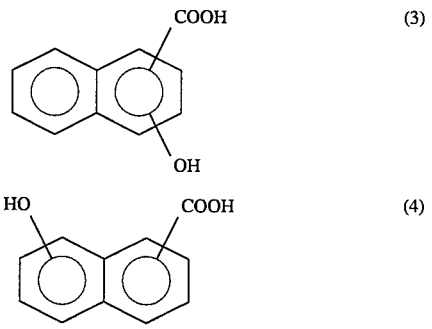

($R^1$ is an alkylene group having 1 to 10 carbon atoms, ethynylene group or —CH$_2$CO—.)

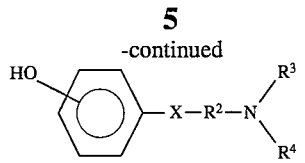

(X is —C(=O)—O— or —C(=O)—NH—, $R^2$ is an alkylene group having 1 to 4 carbon atoms, and $R^3$ and $R^4$ are each a methyl group or an ethyl group.)

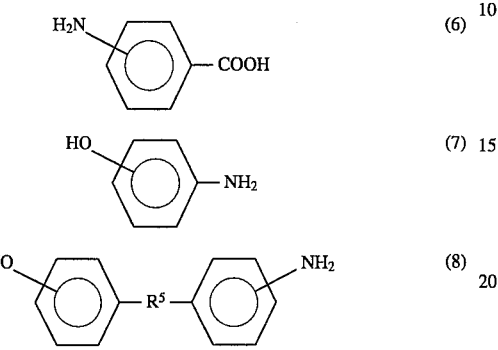

($R^5$ is a direct bond, —O—, —SO$_2$—, —CH$_2$—, —C(CH$_3$)$_2$— or —C(CF$_3$)$_2$—.)

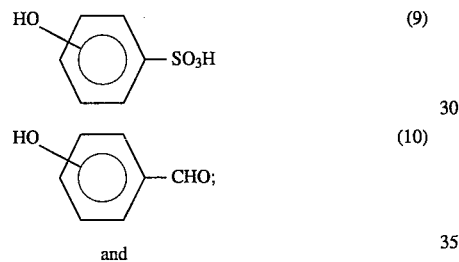

and polyamic acid represented by the following formula (11):

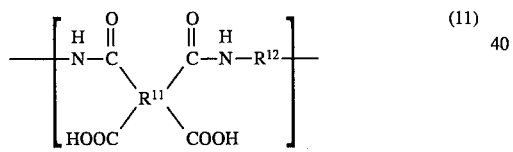

($R^{11}$ is a tetravalent organic group, and $R^{12}$ is a divalent organic group.)

According to a fourth aspect of the invention, there is provided a polyamic acid composition which comprises:

at least one component selected from the group consisting of compounds represented by the following formulas (1) to (4) and (6) to (10) and derivatives thereof:

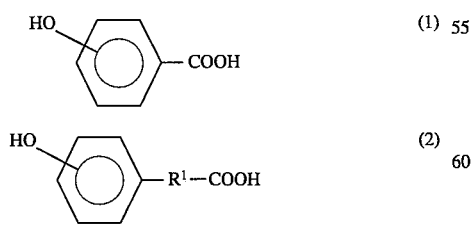

($R^1$ is an alkylene group having 1 to 10 carbon atoms, ethynylene group or —CH$_2$CO—.)

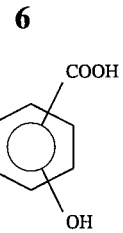

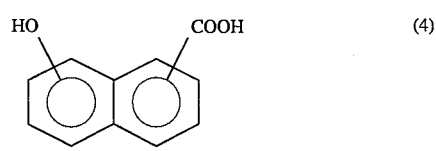

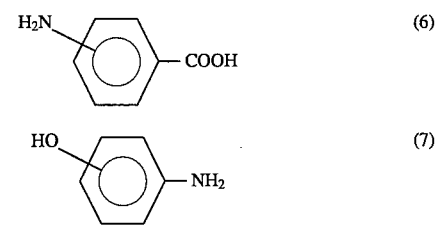

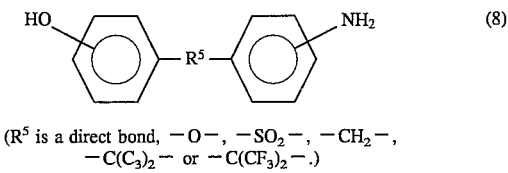

($R^5$ is a direct bond, —O—, —SO$_2$—, —CH$_2$—, —C(C$_3$)$_2$— or —C(CF$_3$)$_2$—.)

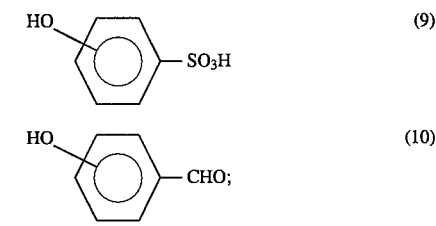

polyamic acid represented by the following formula (11);

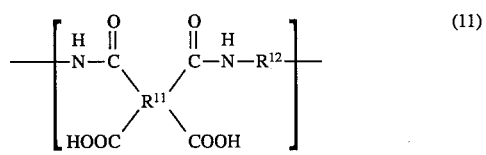

($R^{11}$ is a tetravalent organic group, and $R^{12}$ is a divalent organic group.); and tertiary amine.

The polyamic acid compositions according to the first and second aspects of the present invention are photosensitive. They are used to form polyimide film patterns which serve as passivation films or interlayer insulating films in semiconductor devices. They are also used as photoresist in the manufacture of semiconductor devices. These polyamic acid composition are advantageous in that they can be processed into polyimide film patters or photoresist patterns, each having an improved resolution.

The polyamic acid compositions according to the third and fourth aspects of the present invention are used to form polyimide films which will be used, for example, as liquid-crystal orientation films of a liquid crystal displays. These compositions can be imidized at lower temperatures than the conventional polyamic acid compositions. More precisely, they can be imidized, forming liquid-crystal orientation films of polyimide in a liquid crystal display, at so low a temperature that the color filters used in the display can be prevented from being discolored.

BRIEF DESCRIPTION OF THE DRAWINGS

FIG. 1 is a vertical sectional view of a part of a liquid crystal display;

FIG. 3 is a $^1$HNMR spectrum of the carboxylic acid derivative obtained in Synthesis 1 of the present invention; and FIG. 4 is an infrared absorption spectrum of a polyimide film formed in Example 26 of this invention.

DETAILED DESCRIPTION OF THE PREFERRED EMBODIMENTS

Figure 2:
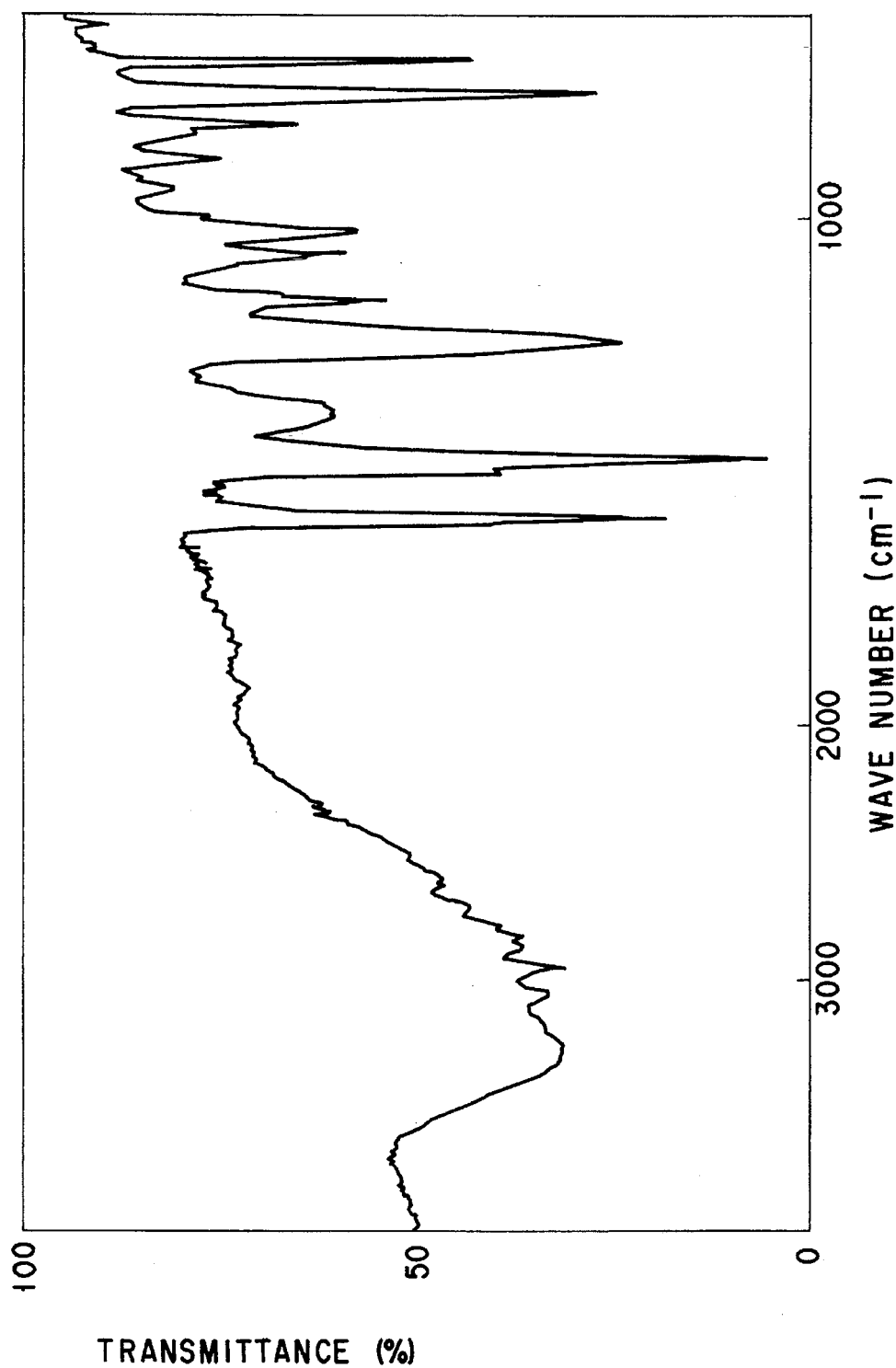
FIG. 2 is an infrared absorption spectrum of a carboxylic acid derivative obtained in Synthesis 1 of the invention.

The present invention will be described in further detail.

The polyamic acid, which is contained in the polyamic acid compositions according to the first to fourth aspect of the invention, all specified above, and which is represented by the formula (11), will be explained first. The polyamic acid used in the present invention is not necessarily limited to specific ones; it can by any that has the repeating unit identified by the formula (11). Such a polyamic acid can be synthesized through the reaction between tetracarboxylic dianhydride and diamine.

The tetracarboxylic dianhydride used in synthesizing the polyamic acid is not restricted particular ones. Examples of the tetracarboxylic dianhydride are: pyromellitic dianhydride, 3,3',4,4'-benzophenonetetracarboxylic dianhydride, 1,4,5,8-naphthalenetetracarboxylic dianhydride, 2,3,6,7-naphthalenetetracarboxylic dianhydride, 1,2,5,6-naphthalenetetracarboxylic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 2,3,3',4'-benzophenonetetracarboxylic dianhydride, 2,2-bis(3,4-dicarboxyphenyl)propane dianhydride, 2,2-bis[3-(3,4-dicarboxyphenoxy)phenyl]propane dianhydride, 2,2-bis[4-(3,4-dicarboxyphenoxy)phenyl]propane dianhydride, bis(3,4-dicarboxyphenyl)sulfone dianhydride, bis(3,4-dicarboxyphenyl)ether dianhydride, bis(3,4-dicarboxyphenyl)methane dianhydride, perylene-3,4,9,10-tetracarboxylic dianhydride, butanetetracarboxylic dianhydride, 2,2-bis(3,4-dicarboxyphenyl)hexafluoropropane dianhydride, bis(3,4-dicarboxyphenyl)dimethylsilane dianhydride, 1,4-bis(3,4-dicaboxyphenyldimethylsilyl)benzene dianhydride, 1,3-bis(3,4-dicarboxyphenyl)-1,1,3,3-tetramethyldisiloxane dianhydride, cyclobutane-1,2,3,4-tetracarboxylic dianhydride, and tetrahydrofuran-2,3,4,5-tetracarboxylic dianhydride. These tetracarboxylic dianhydrides may be used singly or in combination.

The diamine used in synthesizing the polyamic acid is not restricted to particular ones, but is preferably an aromatic diamine. Examples of the aromatic diamine are: m-phenylenediamine, p-phenylenediamine, 2,4-tolylenediamine, 4,4'-diaminodiphenyl ether, 4,4'-diaminodiphenylmethane, 4,4'-diaminodiphenyl sulfone, 4,4'-diaminodiphyenylsulfide, 2,2-bis(4-aminophenyl)propane, 2,2-bis(4-aminophenyl)hexafluoropropane, 3,4'-diaminodiphenyl ether, 3,3'-diaminodiphenyl ether, 3,3'-diaminodiphenyl ketone, 4,4'-diaminophenyl ketone, 4,4'-diaminobenzanilide, bis(4-aminophenyl)dimethylsilane, 1,3-bis(4-aminophenyl)-1,1,3,3-tetramethyldisiloxane, 1,3-bis(3-aminophenoxy)benzene, 1,3-bis(4-aminophenoxy)benzene, 1,4-bis(3-aminophenoxy)benzene, 4-methyl-2,4-bis(4-aminophenyl)-1-pentene, 4-methyl-2,4-bis(4-aminophenyl)-2-pentene, 1,4-bis(α,α-dimethyl-4-aminobenzil)benzene, imino-di-p-phenylenediamine, 1,5-diaminonaphthalene, 2,6-diaminonaphthalene, 4-methyl-2,4-bis(4-aminophenyl)pentane, 5(or 6)-amino-1-(4-aminophenyl)-1,3,3-trimethylindan, bis(4-aminophenyl)phosphine oxide, 4,4'-diaminoazobenzene, 4,4'-diaminodiphenyl urea, 4,4'-bis(4-aminophenoxy)biphenyl, 2,2-bis[4-(4-aminophenoxy)phenyl]propane, 2,2-bis[4-(3-aminophenoxy)phenyl]propane, 4,4'-bis(4-aminophenoxy)benzophenone, 4,4'-bis(3-aminophenoxy)diphenyl sulfone, 4,4'-bis(4-aminophenoxy)diphenyl sulfone, 4,4'-bis[4-(α,α-dimethyl-4-aminobenzil)phenoxy] benzophenone, 4,4'-bis[4-α,α-dimethyl-4-aminobenzil)phenoxy]diphenyl sulfone, 2,2-bis[4-(4-aminophenoxy)phenyl]hexafluoropropane, 3,5-diamino-1-hydroxybenzene, 3,3'-dihydroxy-4,4'-diaminobiphenyl, 4,4'-dihydroxy-3,3'-diaminobiphenyl, 2,2-bis(4-amino-3-hydroxyphenyl)propane, 2,2-bis(3-amino-4-hydroxyphenyl)propane, bis(3-amino-4-hydroxyphenyl)sulfide, bis(3-amino-4-hydroxyphenyl)sulfone, bis(3-amino-4-hydroxyphenyl)methane, bis(4-amino-3-hydroxyphenyl)methane, 2,2-bis(4-amino-3-hydroxyphenyl) hexafluoropropane, and 2,2-bis(3-amino-4-hydroxyphenyl) hexafluoropropane.

Each hydrogen atom in the aromatic ring of any of these aromatic diamines may be substituted with at least one selected from the group consisting of a chlorine atom, a fluorine atom, a bromine atom, methyl group, methoxy group, cyano group, phenyl group and amino group.

The diamine used in synthesizing the polyamic acid may be other than an aromatic diamine. Examples of such diamine are: dimethylenediamine, trimethylenediamine, tetramethylenediamine, hexamethylenediamine, heptamethylenediamine, octamethylenediamine, nonamethylenediamine, decamethylenediamine, 1,2-bis(3-aminopropoxy)ethane, $H_2N-(CH_2)_3-O-(CH_2)_2-O-(CH_2)_3-NH_2$, 1,4-diaminocyclohexane, 4,4'-diaminodicyclohexylmethane, 1,3-bisaminomethylcyclohexane, 1,4-bisaminomethylcyclohexane, 1,3-diaminocyclohexane, 4,4'-diaminodicyclohexylisopropane, 1,4-xylenediamine, 2,6-diaminopyridine, 2,4-diamino-S-triazine, 1,3-bis(γ-aminopropyl)-1,1,3,3-tetramethyldisiloxane, 1,4-bis(γ-aminopropyldimethylsilyl)benzene, 1,3-bis(4-aminobutyl)-1,1,3,3-tetramethyldisiloxane, 1,1,3,3-tetramethyldisiloxane, and 1,3-bis(γ-aminopropyl)-1,1,3,3-tetraphenyldisiloxane.

The various diamines, exemplified above, may be used singly or in combination.

To synthesize the polyamic acid which has the repeating unit identified by the formula (11), any tetracarboxylic dianhydride specified above and any diamine specified above are subjected to polycondensation in an organic solvent. Examples of the organic solvent are: N,N-dimethylformamide, N,N-dimethylacetoamide, N-methyl-2-pyrrolidone, N-methyl-ε-caprolactam, γ-butyrolactone, sulfolane, N,N-dimethylsulfoxide, N,N,N'N'-tetramethylurea, tetrahydrofuran, methyl cellosolve acetate, diglyme, and cyclohexanone.

The molar ratio in which the tetracarboxylic dianhydride and the diamine are used to synthesize said polyamic acid composition is preferably 0.9:1 to 1.1:1, more preferably 1:1. The reaction between the dianhydride and the diamine should be performed at −10° to 100° C. for 0.5 to 24 hours. The polyamic acid having the repeating unit of the formula

(11) can be synthesized without dehydration and will not be gelled, unlike polyamic acid having the repeating unit represented by the formula (A).

The polyamic acid thus synthesized is not limited to one having a particular molecular weight. Nonetheless, the polyamic acid should have a molecular weight high enough to form a coating on a substrate, which has a sufficient physical strength. In view of this it is desirable that the polyamic acid have a logarithmic viscosity of 0.10 dl/g or more, measured in N-methyl-2-pyrrolidone solution at 30° C., with the polymer concentration set at 0.5 g/dl.

To adjust the molecular weight of the polyamic acid being synthesized, a dicarboxylic anhydride such as phthalic anhydride, maleic anhydride, succinic anhydride or nadic anhydride, or a monoamine such as aniline, aminophenol or 2-(4-aminophenyl)-2-(4-hydroxyphenyl)propane can be used, if necessary, in combination with tetracarboxylic dianhydride and diamine.

The polyamic acid synthesized under the conditions described above can be used in the form of a solution. Alternatively, it can be used in the form of a solid which has been prepared by pouring a polyamic acid solution into a poor solvent such as water, methanol, ethanol, isopropyl alcohol or acetone, thereby precipitating a polymer, and by washing, drying and collecting the polymer.

If necessary, polyimide which has the repeating unit represented by the following formula (12) and which can be dissolved in an organic solvent may be mixed with the polyamic acid composition of the present invention. The polyimide can be obtained by cyclizing its precursor, i.e., polyamic acid. The cyclization is achieved by either a heat treatment or a chemical treatment. In the first method, a polyamic acid solution is heated in the presence of an organic solvent such as toluene, xylene or chlorobenzene, which forms azeotrope with water, and the water as the by-product of the cyclization is removed by means of azeotropic distillation thereby cyclizing the polyamic acid. In the second method, a polyamic acid solution is made to react for 1 minute to 24 hours at −20° to 150° C. in the presence of a dehydrating agent or a catalyst, such as acetic anhydride, polyphosphoric acid, triphenylphosphine, triphenyl phosphite, dicyclohexylcarbodiimide, triethylamine, pyridine, choline chloride, sodium acetate, manganese acetate or cobalt acetate, thus forming polyimide. The polyimide, prepared by either method, is a solution, a suspension, or a slurry. If prepared in the form of a solution, the polyimide is applied as such. If prepared in the form of a suspension or a slurry, the polyimide is introduced into a poor solvent such as water, methanol, ethanol, isopropyl alcohol or acetone, thus precipitating a polymer. The polymer is washed and dried into solid polyimide, which is used.

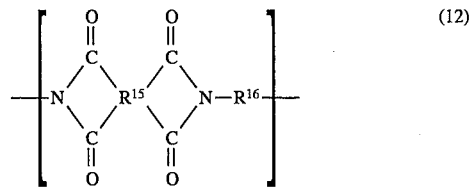

(12)

($R^{15}$ is a tetravalent organic group and $R^{16}$ is a divalent organic group.)

In the case where the polyamic acid having the repeating unit of the formula (11) and the polyimide having the repeating unit of the formula (12) are used together, thus preparing the polyamic acid composition according to the present invention, it is desirable that the polyimide content be 80 wt % or less of the total amount of the polyamic acid and the polyimide. If the polyimide content is more than 80 wt %, a polyimide film made from the polyamic acid composition is likely to adhere to a substrate but not firmly. If the polyamic acid composition has a polyimide content of more than 80 wt % and a film of this composition, used as photosensitive resin, is exposed to light applied through a mask to form a polyimide film pattern, the exposed parts and the unexposed parts can hardly be dissolved in an alkali development solution. Consequently, the resultant polyimide film pattern may fail to have a sufficiently high resolution.

A polyamic acid derivative with phenolic hydroxyl groups introduced at side chains and having the repeating unit represented by the formula (A) may also be used in the polyamic acid composition of this invention. The content of the polyamic acid derivative should be at most 70 wt %, preferably at most 60 wt %, of the total amount of the polyamic acid and, if used, the polyimide.

The polyamic acid composition according to the first aspect of the present invention will now be described in detail.

The polyamic acid composition according to the first aspect of the invention comprises: at least one component selected from the group consisting of compounds represented by the formulas (1) to (5) and derivatives thereof; polyamic acid represented by the formula (11); and photosensitizer.

In the first aspect of the invention, the compounds of the formulas (1) to (5) and the derivatives thereof have phenolic hydroxyl groups each. These compounds have function of inhibiting polyamic acid from dissolving in an alkali development solution.

A carboxylic acid compound represented by the formula (1) is, for example, hydroxybenzoic acid. A carboxylic acid compound represented by the formula (2) are, for example, hydroxyphenyl acetic acid hydroxyphenylpyruvic acid and hydroxyphenylcinnamic acid. A carboxylic acid compound represented by the formula (3) or (4) is, for example, hydroxynaphthoic acid. Examples of a carboxylic ester or carboxylic amide, represented by the formula (5), are:

N,N-dimethylaminomethyl hydroxybenzoate,
N,N-diethylaminomethyl hydroxybenzoate,
2-N,N-dimethylaminoethyl hydroxybenzoate,
2-N,N-diethylaminoethyl hydroxybenzoate,
3-N,N-dimethylaminopropyl hydroxybenzoate,
3-N,N-diethylaminopropyl hydroxybenzoate,
2-N,N-dimethylaminopropyl hydroxybenzoate,
2-N,N-diethylaminopropyl hydroxybenzoate,
1-methyl-2-N,N-dimethylaminoethyl hydroxybenzoate,
1-methyl-2-N,N-diethylaminoethyl hydroxybenzoate,
4-N,N-dimethylaminobutyl hydroxybenzoate,
4-N,N-diethylaminobutyl hydroxybenzoate,
3-methyl-3-N,N-dimethylaminopropyl hydroxybenzoate, and
3-methyl-3-N,N-diethylaminopropyl hydroxybenzoate,
2-N,N-dimethylaminoethyl hydroxybenzamide,
2-N,N-diethylaminoethyl hydroxybenzamide,
3-N,N-dimethylaminopropyl hydroxybenzamide,
3-N,N-diethylaminopropyl hydoxybenzamide,
2-N,N-dimethylaminopropyl hydroxybenzamide, and
2-N,N-diethylaminopropyl hydroxybenzamide.

In the compounds of the formulas (1) to (5), the phenolic hydroxyl groups may be bonded at any sites of an aromatic ring, such as the ortho site, the meta site and the para site. The derivatives of the compounds represented by the formulas (1) to (5) are of the type in which each hydrogen atom of the aromatic ring is substituted with hydroxyl group, carboxyl group, a halogen atom, cyano group, nitro group, methyl group, ethyl group, methoxy group or amino group.

The method of synthesizing the carboxylic ester or the carboxylic amide, either represented by the formula (5), is not limited to a particular one. The ester or the amide can be synthesize by, for example, heating carboxylic acid of the formula (1) and tertiary amine of the following formula (13), in the presence of a catalyst. The molar ratio of the tertiary amine to the carboxylic acid is 1:1 to 1:6, more preferably 1:1 to 1:3. The catalyst used in the reaction may be sulfuric acid, phosphoric acid, hydrochloric acid, p-toluenesulfonic acid, or boron trifluoride-diethylether complex. The heating temperature is set at such a value that tertiary amine may be refluxed. The heating time ranges from 1 to 10 hours, more preferably 2 to 7 hours.

(13)

($R^2$ to $R^4$ have same meanings as in Formula (5), and Y is —OH or —$NH_2$.)

In the polyamic acid composition according to the first aspect of the invention, the compounds represented by the formulas (1) to (5) and having phenolic hydroxyl groups should be used in a total amount of 0.05 to 3.0 equivalents with respect to the carboxyl groups of the polyamic acid. If the amount of these compounds is less than 0.05 equivalents, the polyamic acid composition will likely be less photosensitive than desired. If the amount of the compounds is greater than 3.0 equivalents, the composition will be unstable in terms of viscosity during storage, and will form a film which would become excessively thinner when subjected to development process. Preferably, the total amount of these compounds is 0.1 to 2.0 equivalents with respect to the carboxyl groups of the polyamic acid. If the polyimide is used with the polyamic acid, the compound having a phenolic hydroxyl group may be further mixed with the composition up to 20 wt % with respect to the polyimide, in addition to the amount provided above.

The photosensitizer used in the first aspect of the present invention can be o-quinonediazide compound which has at least one o-quinonediazido group in the molecule, or naphthoquinonediazide compound which has at least one naphthoquinonediazido group in the molecule. More specifically, at least one selected from the group consisting of the compounds represented by the following formulas. These photosensitizers have function of inhibiting polyamic acid from dissolving in an alkali development solution, while their effects are very lower than those of the compounds represented by the formulas (1) to (5).

 (P-1)

 (P-2)

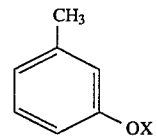 (P-3)

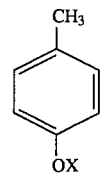 (P-4)

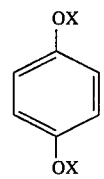 (P-5)

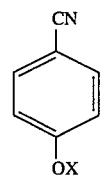 (P-6)

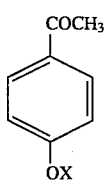 (P-7)

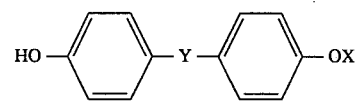 (P-8)

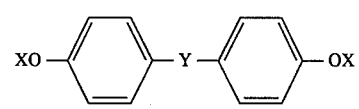 (P-9)

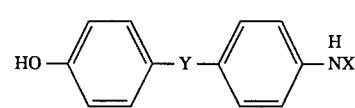 (P-10)

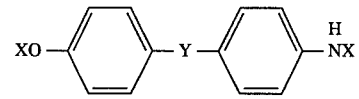 (P-11)

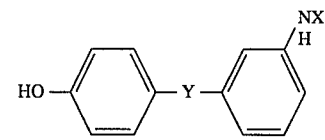 (P-12)

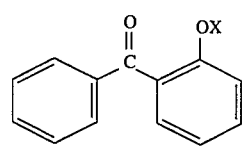 (P-13)

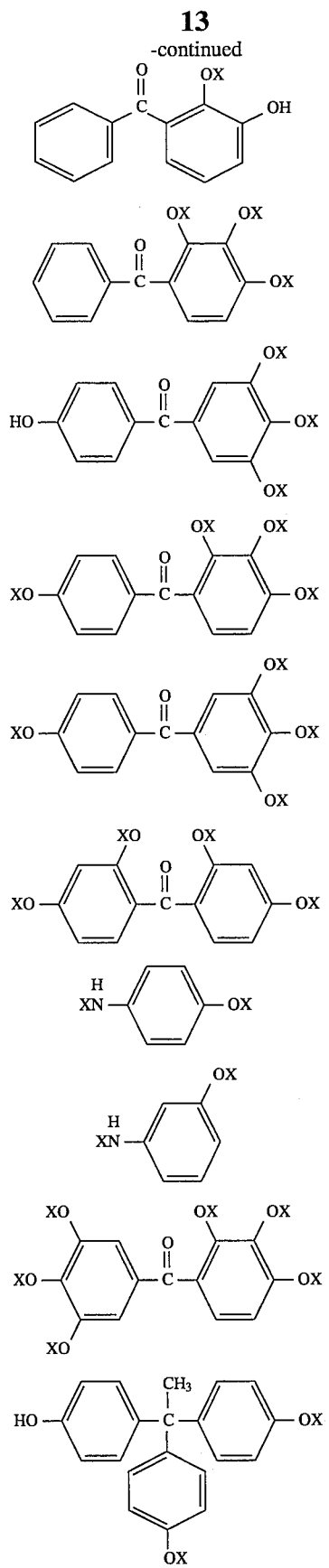
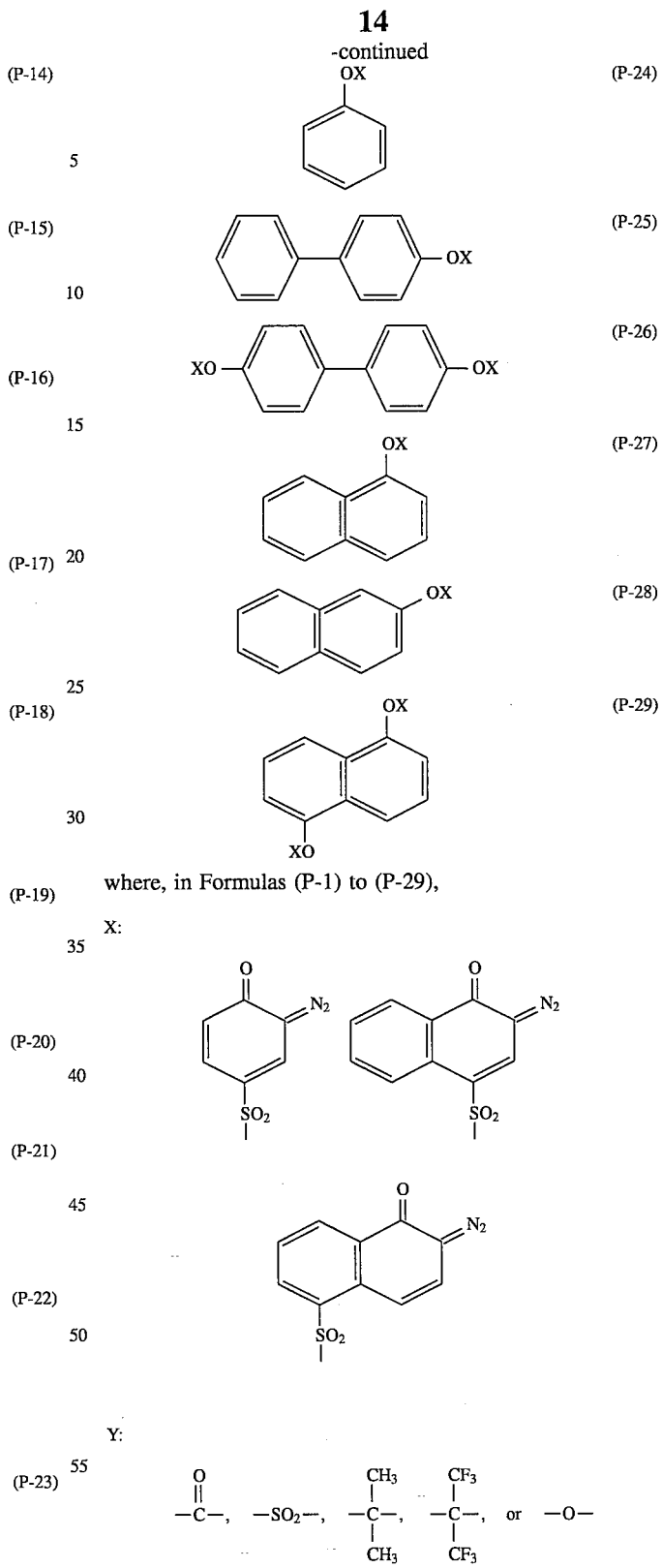
where, in Formulas (P-1) to (P-29),
Of the photosensitizers specified above, 1,2-naphthoquinonediazide sulfonate of 2,3,4-trihydroxybenzophenone, i.e., compound P-15, 1,2-naphthoquinonediazide sulfonate of 2,3,4,4'-tetrahydroxybenzophenone, i.e., compound P-17, and 1,2-naphthoquinonediazide sulfonate of 2,3,3',4,4',5'- hexahydroxybenzophenone, i.e., compound P-22, are photosensitizers particularly suitable for use in the present invention. In compound P-17, i.e., 2,3,4,4'-tetrahydroxybenzophenone 1,2-naphthoquinonediazide sulfonate, the percentage of estrification of 2,3,4,4'-tetrahydroxybenzophenone with 1,2-naphthoquinonediazide sulfonic acid or the derivative thereof is usually 40 to 100% with respect to all hydroxyl groups in the benzophenone compound have been esterified. In other words, 1.6 to 4 naphthoquinonediazide molecules, on average, have been introduced for each 2,3, 4,4'-tetrahydroxybenzophenone molecule (having four hydroxyl groups). Thus, this photosensitizer (P-17) is a mixture of sulfonic esters having one, two, three or four naphthoquinonediazide groups. Similarly, in the case of compound P-22, i.e., 2,3,3',4,4',5'-hexahydroxybenzophenone 1,2-naphthoquinonediazide sulfonate, 2,4 to 6 naphthoquinonediazide molecules, on average, have been introduced for each 2,3,4,4',5'-tetrahydroxybenzophone molecule (having six hydroxyl groups); thus this photosensitizer (P-22) is a mixture of sulfonic esters having one, two, three, four, five, or six naphthoquinonediazide groups.

In the first aspect of the present invention, it is desirable to use the photosensitizer in an amount of 1 to 50 wt % of the total amount of the polyamic acid and, if used, the polyimide. If the photosensitizer is used in too small an amount, the resultant polyamic acid composition will exhibit but an insufficient photosensitivity. If the photosensitizer is used in too large an amount, a residue will remain in the resultant polyimide film pattern and will likely to degrade the characteristic of the polyimide film pat tern. It is more preferable that the photosensitizer be used in an amount ranging from 5 to 30 wt % of the total amount of the polyamic acid and the polyimide.

If necessary, a sensitizer, a dye, a surfactant, a coupling agent, and an alkali-soluble resin may be added to the polyamic acid composition according to the first aspect of the invention. Specific examples of the coupling agent are aminosilane and epoxysilane. Specific examples of the alkali-soluble resin are: poly-p-vinylphenol, poly-o-vinylphenol, poly-m-isopropylphenol, a m- or p-cresol novolak resin, xylenol novolak resin, p-vinylphenol, a copolymer of p-vinylphenol and methyl methacrylate, a copolymer of p-isopropenylphenol and maleic anhydride, and polymethacrylic acid.

In most cases, the polyamic acid composition according to the first aspect of this invention is used as a varnish, dissolved in an organic solvent. The organic solvent is not restricted to a particular one. Rather, it can be any organic solvent that can dissolve the components of the composition, i.e., the polyamic acid, the polyimide (if used), at least one of the compounds represented by the formulas (1) to (5), and the photosensitizer. Specific examples of the organic solvent are: ketone-based solvents such as cyclohexanone, methyl ethyl ketone, and methyl isobutyl ketone; cellosolve-based solvents such as methyl cellosolve, methyl cellosolve acetate, ethyl cellosolve acetate, and butyl cellosolve acetate; ester-based solvents such as ethyl acetate, butyl acetate, and isoamyl acetate; ether-based solvents such as tetrahydrofuran, dioxane, ethylene glycol dimethyl ether, ethylene glycol diethyl ether, diethylene glycol dimethyl ether, and diethylene glycol diethyl ether; and others solvents such as N,N-diemthylformamide, N,N-dimethylacetoamide, N-methyl-2-pyrrolidone, N-methyl-ε-caprolactam, γ-butyrolactone, sulfolane, xylene, toluene, chlorobenzene, m-cresol, ethylene glycol, and propylene glycol. These solvents, exemplified here, may be used singly or in combination.

A method of forming a polyimide film pattern will be described, in which the polyamic acid composition according to the first aspect of the invention is used as a photosensitive resin composition. Generally, a polyamic acid is coated, dried, exposed to light applied through a mask, developed with an alkali development solution, and subjected to heat curing, thereby forming a polyimide film pattern. In the method to be described below, a composition is used which contains 1,2-napththoquinonediazide sulfonate.

First, the varnish made of the polyamic acid composition according to the first aspect of the invention is passed through a filter, thereby removing fine particles mixed into the composition. The varnish is coated on a semiconductor wafer by spin-coating or dipping method, thus forming a resin layer. Greatly soluble in an organic solvent, the composition of this invention can easily form a thick film.

Next, the resin layer is dried at about 60° to 100° C. for about 1 to 30 minutes. Energy radiation, such as X-rays, visible light, infrared rays, ultraviolet rays, or an excimer-laser beam, is applied onto the dried resin layer through a desirable pattern mask. In those portions of the layer, which have exposed to the energy radiation, the photosensitizer, i.e., 1,2-naphthoquinonediazide (a) undergoes photochemical reaction, changing into ketene (b).

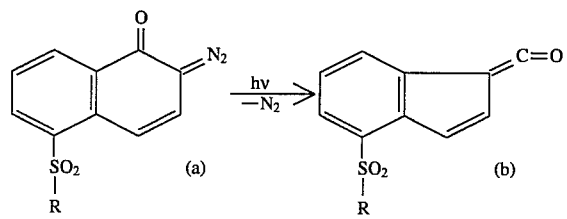

Then, the resin layer, partly exposed to radiation, is developed with an alkali development solution, by means of spray method or paddle method. Examples of the alkali development solution are: an aqueous solution of an inorganic alkali such as potassium hydroxide, sodium hydroxide, lithium hydroxide, sodium carbonate, potassium carbonate, ammonium carbonate, potassium hydrogencarbonate, ammonium phosphate, or ammonia, and an aqueous solution of an organic alkali such as propylamine, butylamine, monoethanolamine, ethylenediamine, trimethylenediamine, hydrozine, trimethylammonium hydroxide, or trimethylhydroxyethylammonium hydroxide. Use may also be made of a mixture of any one of these aqueous solution and an organic solvent such as methanol, ethanol, 2-propanol, ethylene glycol, ethyl cellosolve, butyl cellosolve, diethylene glycol, ethyl carbitol, N-methylpyrrolidone, N,N-dimethylformamide, N,N-dimethylacetoamide or dimethylsulfoxide. Since the alkali development solution used in the invention is largely an alkali aqueous solution, it will not cause the resultant polyimide film pattern to swell.

During the developing process, the compound of the formula (1), (2), (3), (4) or (5) and the 1,2-naphthoquinonediazide sulfonate, which are present in the unexposed parts of the resin layer, inhibit the polyamic acid (i.e., the resin component of the composition) from being dissolved in the alkali development solution. Hence, the unexposed part of the resin layer are less alkali-soluble than the polymer only. If the compound used is one represented by the formula (5), i.e., carboxylic ester or carboxylic amide, the amino group (N) of the carboxylic derivative and the carboxyl group (O) of the polyamic acid form ionic bond in the varnish, as is shown in the following formula (14). This is substantially equivalent to that a polyamic acid derivative having a phenolic hydroxyl group at the side chain is generated, without any chemical reaction, effectively preventing the unexposed part of the resin layer from being dissolved in the alkali development solution.

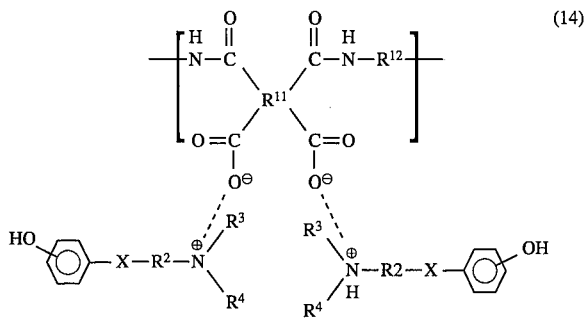

($R^2$ to $R^4$, $R^{11}$, $R^{12}$ and X have same meanings as in Formulas (5) and (11).)

The carboxylic derivative of the formula (5) may decompose, in the varnish, into carboxylic acid and tertiary amine which are represented by the formulas (1) and (13), respectively. Even if the polyamic acid composition of the invention contains tertiary amine decomposed from the carboxylic derivative, the composition will not have its photosensitivity lowered. With the composition of this invention it does not matter at all even if all or part of the carboxylic derivative of the formula (5) decomposes into carboxylic acid and tertiary amine.

In the exposed parts of the resin layer, ketene (b) changes into carboxylic acid (c), reacting with the water contained in the development solution, as can be understood from the following formula. The carboxyl group in the carboxylic acid (c) reacts with the alkali metal ion or ammonium ion contained in the alkali development solution, thus forming a salt. Due to the salt, the exposed parts of the resin layer are dissolved in the development solution.

As a result, only the unexposed parts of the resin layer remain on the semiconductor wafer, thus forming a patterned resin layer. Thus, the polyamic acid composition according to the first aspect of the invention serves as a positive-working photosensitive material that the exposed parts are rendered soluble with a development solution, provided that it contains 1,2-naphthoquinonediazide sulfonate used as photosensitizer.

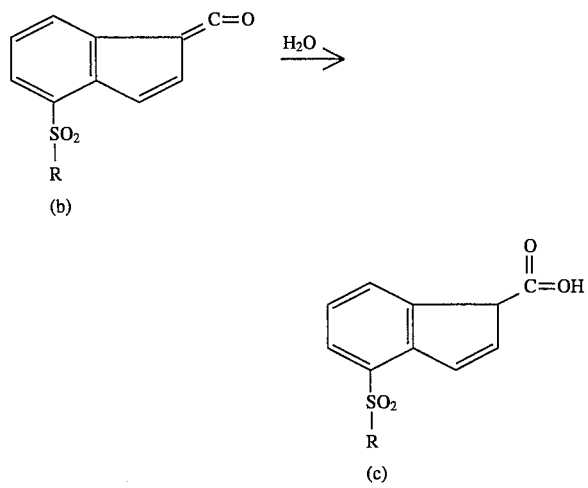

After the development process, the resin layer may be rinsed with water, alcohol, acetone, or the like, thereby removing the residue of the development solution from the resin layer. The layer may be subsequently baked.

The patterned resin layer is then heated at a predetermined temperature. The solvent is thereby evaporated from the patterned resin layer. Simultaneously, the polyamic acid in the resin layer is cyclized, acquiring imide structure, and the carboxylic acid compound, the photosensitizer and the like are removed from the rein layer. As a result of this, there is formed a polyimide film pattern which has a repeating unit represented by the following formula (15):

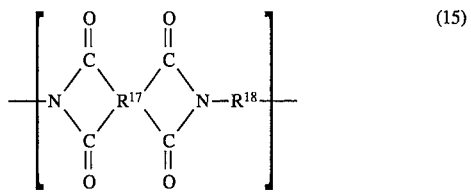

($R^{17}$ corresponds to $R^{11}$ in Formula (11) or $R^{11}$ and $R^{15}$ in Formulas (11) and (12), and $R^{18}$ corresponds to $R^{12}$ in Formula (11) or $R^{12}$ and $R^{16}$ in Formulas (11) and (12).

In the heating process, the patterned resin layer should be heated gradually, from room temperature to 150° to 450° C. which is the final heating temperature. If the final heating temperature is lower than 150° C., part of the polyamic acid in the resin may remain unchanged into imide, degrading the thermal stability of the resultant polyimide film pattern. If the final heating temperature exceeds 450° C., the imidized polymer is likely to decompose.

The polyamic acid composition according to the first aspect of this invention may be processed to form a polyimide film pattern in another method, in which the resin layer made of the composition, already dried and exposed, is heated before it is treated with an alkali development solution. In this method, it is desirable that the resin layer subjected to exposure be heated at 90° to 200° C., more preferably 90° to 140° C., for about 5 seconds to 60 minutes. Depending on the type of the 1,2-naphthoquinonediazide sulfonate contained in the composition, the ketene (b) formed as the selected parts of the layer are exposed to light reacts with the polyamic acid or the active hydrogen present in the polyimide, thereby cross-linking the polymer chains. Each exposed part of the resin layer is therefore acquire a higher molecular weight and becomes less soluble with the alkali development solution. In each unexposed part of the resin layer, part of the 1,2-naphthoquinonediazide sulfonate decomposes during the heating process, losing its ability to inhibit the alkali-solubility of the polyamic acid or having this ability reduced. The polyamic acid in each unexposed part of the layer is dissolved with the alkali development solution. Hence, only the exposed parts of the resin layer remain on the semiconductor wafer, forming a polyimide film having a specific pattern.

Therefore, the polyamic acid composition according to the first aspect of the invention serves as a negative-working photosensitive material that the exposed parts are rendered insoluble with a development solution, provided that it contains 1,2-naphthoquinonediazide sulfonate used as photosensitizer and that the resin layer is heated after subjected to exposure.

As indicated above, the polyamic acid composition according to the first aspect of the invention can be used, without use of the photoresist, to form a passivation film or the like, which is heat-resistant and which has a sharp relief pattern. Since no dehydration involves in synthesizing polyamic acid, the polyamic acid will not be galled at all. In addition, since the development solution applied to the light-exposed resin layer is an alkali aqueous solution, it will not cause the resultant polyimide film pattern to swell, whereby the pattern has a sufficiently high resolution. Furthermore, the polyamic acid can acquire a higher molecular weight while being synthesized, the resultant polyimide film pattern will steadfastly adhere to the substrate.

The polyamic acid composition according to the first aspect of the present invention may also be applied as photoresist for use in the manufacture of microstructural devices. For instance, the composition is coated on a substrate, exposed to light applied through a mask, and then developed, thereby forming into a patterned resin layer. The patterned resin layer is baked at 90° to 180° C., if desired. Using the film pattern as an etching mask, either dry etching or wet etching is performed on the substrate. Dry etching is preferred, particularly in order to form a fine pattern having a width of 3 µm or less.

To form a silicon oxide film pattern by means of wet etching, an aqueous solution of hydrofluoric acid ammonia fluoride, or the like is used as etchant. To form an aluminum film pattern by means of wet etching, an aqueous solution of phosphoric acid, acetic acid, nitric acid, or the like, is applied as etchant. To form a chromium-based film pattern by wet etching, an aqueous solution of cesium ammonium nitrate or the like is used as etchant. To form a film pattern by means of dry etching, $CF_4$, $C_2F_6$, $CCl_4$, $BCl_3$, $Cl_2$, HCl, or $H_2$ may be used as etching gas. If necessary or desirable, these etching gases can be applied in any possible combination.

The etching conditions are determined in accordance with the material of the film to be etched, the type of the polyamic acid composition used, the concentration of the wet etchant filled in the reaction tank, the concentration of the dry etching gas applied, the reaction temperature, the reaction time, and the like. The method of wet- or dry-etching the film is not limited to a particular one. After the etching, the resin film pattern made of the polyamic acid composition is peeled from the substrate, by applying to the substrate a peeling agent (e.g., HE-1 manufactured by Wako Junyaku Co., Ltd.), oxygen-gas plasma, or the like.

As describe above, when the polyamic acid composition according to the first aspect of the present invention is used as photoresist, it will serve to form film patterns of various materials, which have a high resolution and which can therefore be employed in the manufacture of microstructural devices.

The polyamic acid composition according to the second aspect of the present invention will now be described.

The polyamic acid composition according to the second aspect of the invention comprises: at least one component selected from the group consisting of compounds represented by the formulas (1) to (5) and derivatives thereof; polyamic acid represented by the formula (11); a dissolution inhibitor; and a compound capable of generating an acid when irradiated with light.

The polyamic acid having a repeating unit represented by the formula (11) and the compounds represented by the formulas (1) to (5) are identical to those explained in conjunction with the polyamic acid composition according to the first aspect of this invention, and will not be described here. Polyamic acid having the repeating unit identified by the formula (12) and polyamic acid having the repeating unit represented by the formula (A) may also be used in the composition according to the second aspect of the invention, as in the composition according to the first aspect of the invention. The polyamic acid composition according to the second aspect of the invention may contain, if necessary a sensitizer, a dye, a surfactant, a coupling agent, and an alkali-soluble resin.

The dissolution inhibitor used in the second aspect of the invention is a compound which inhibits the polyamic acid from being dissolved in an alkali development solution when it coexists with any one of the compounds represented by the formulas (1) to (5), and which has a group unstable with an acid. More specifically, the dissolution inhibitor may be at least one compound selected from the group consisting of the above-mentioned diazide compounds (P-1) to (P-29) compounds represented by the formulas (P-1) to (P-29) where X is —$CO_2C(CH_3)_3$, —$C(CH_3)_3$ or —$Si(CH_3)_3$, and the group consisting of the compounds (P-30) to (P-35) of the following formulas, i.e., aromatic compounds having tertbutyl group or trimethylsily group, or phenyl benzoate:

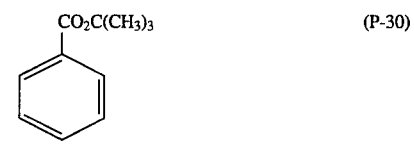
(P-30)

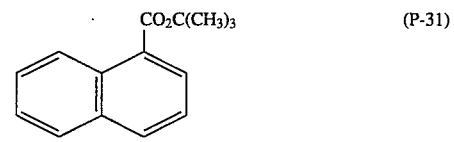
(P-31)

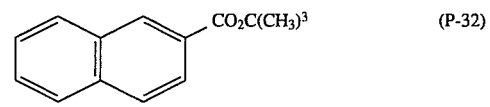
(P-32)

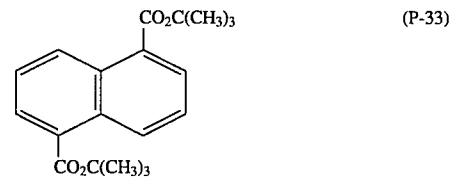
(P-33)

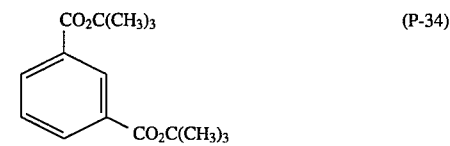
(P-34)

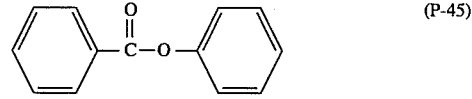
(P-45)

In the second aspect of the present invention, the dissolution inhibitor is used, preferably in an amount of 1 to 60 wt % of the total amount of the polyamic acid and, if used the polyimide. If the dissolution inhibitor is used in too small an amount, the resultant polyamic acid composition will exhibit but an insufficient photosensitivity. If it is used in too large an amount, the residual dissolution inhibitor will remain in the resultant polyimide film pattern pattern and will likely to degrade the characteristic of the polyimide film pattern. More preferably, the dissolution inhibitor is used in an amount ranging from 5 to 30 wt % of the total amount of the polyamic acid and the polyimide.

Examples of the compound capable of generating an acid when irradiated with light, used in the second aspect of the invention, are: an onium salt such as diazonium salt, phosphonium salt, sulfonium salt or iodonium salt, each having an anion such as $CF_3SO_3$—, p-$CH_3phSO_3$— or p-$NO_2phSO_3$— (ph: phenylene group), an organic halogen compound, and naphthoquinonediazide-4-sulfonate. Of these, the organic halogen compound is one which generates hydrogen halide acid when irradiated with light. Examples of the organic halogen compound are disclosed in U.S. Pat. Nos. 3,515,552, 3,779,778, and west German Patent Laid-Open Publication 22 43 621. Examples of the compounds other than the organic halogen compound are disclosed in Jpn. Pat. Appln. KOKAI Publication 54-74728, Jpn. Pat. Appln. KOKAI Publication 55-24113, Jpn. Pat. Appln. KOKAI Publication 55-77742, Jpn. Pat. Appln. KOKAI Publication 60-3626, Jpn. Pat. Appln. KOKAI Publication 60-138539, Jpn. Pat. Appln. KOKAI Publication 56-17345, and Jpn. Pat. Appln. KOKAI Publication 50-36209. Specific examples of this compound are: di(p-tert-butylphenyl) diphenyliodonium trifluoromethane sulfonate, benzointosylate, orthonitrobenzyl p-toluenesulfonate, triphenylsulfonium trifluoromethanesulfonate, tri(tert-butylphenyl)sulfonium trifluoromethanesulfonate, benzenediazonium p-toluene sulfonate, 4-(di-n-propylamino)benzonium tetrafluoroborate, 4-p-tolylmercapt-2,5-diethoxybenzenediazonium hexafluorophosphate, tetrafluoroborate, diphenylamine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinone, 2,4-dimethyl-1-tribromoacetylbenzene, 4-dibromoacetylbenzoic acid, 1,4-bis(dibromomethyl)benzene, tris(dibromomethyl)-S-triazine, 2-(6-methoxynaphth-2-yl)-4,6-bis(trichloromethyl)-S-triazine, 2-(naphth-1-yl)-4,6-bis(trichloromethyl)-S-triazine, 2-(naphthyl-2-yl)-4,6-bis(trichloromethyl)-S-triazine, 2-(benzopyran-3-yl)-4,6-bis(trichloromethyl)-S-triazine, 2-(4-methoxyanthracen-1-yl)-4,6-bis-trichloromethyl)-S-triazine, 2-(phenanthr-9-yl)-4,6-bis(trichloromethyl)-S-triazine, and 1,2-naphthoquinonediazide-4-sulfonate.

In the second aspect of the present invention, the compound capable of generating an acid when irradiated with light is used, preferably in an amount of 0.01 to 20 wt %, and more preferably 0.1 to 10 wt % of the total amount of the polyamic acid and, if used, the polyimide. If this compound is used in an amount less than 0.01 wt %, to the resultant polyamic acid composition will exhibit but an insufficient photosensitivity. If the compound is used in an amount exceeding 20 wt %, the resultant polyamic acid composition will likely fail to be readily coated on a substrate or to form a sufficiently strong coating adhering firmly to a substrate.

Like the composition according to the first aspect of the invention, the polyamic acid composition according to the second aspect of this invention is used as a varnish, dissolved in an organic solvent. In order to form a polyimide film pattern by using the polyamic acid composition according to the second aspect of the invention, the composition is coated on a substrate, forming a film, and the film is first dried, then exposed to light applied through a mask, next developed with an alkali developer solution and finally subjected to heat curing, forming a polyimide film pattern.

The condition of the resin layer which has been subjected to exposure will be described. In each unexposed part of the resin layer, the polyamic acid, which is the resin component of the composition, interacts with the dissolution inhibitor and is therefore rendered insoluble with the alkali developer solution. In each exposed part of the resin layer, the acid-generating compound generates an acid, which decomposes the dissolution inhibitor. As a result, the dissolution inhibitor can no longer inhibit the polyamic acid from being dissolved in an alkali developer solution, and the polyamic acid can be readily dissolved with the developer solution. Thus, when the resin layer is treated with the developer solution, the exposed parts are dissolved away, while the unexposed parts remain intact on the substrate, whereby a predetermined pattern is formed on the substrate. Thus, the polyamic acid composition according to the second aspect of the invention generally serves as a positive-working photosensitive material that the exposed parts are rendered soluble with a developer solution.

Before the development process, the resin layer subjected to exposure may be heated to 70° to 120° C. for 30 seconds to 5 minutes by means of a hot plate or an oven. This heating promotes the reaction between the dissolution inhibitor and the acid generated during the exposure process. After the development process, the resin layer may be rinsed or baked for the purpose of removing the residual developer solution from the resin layer. The resin layer thus developed and having a predetermined pattern is heated at a prescribed temperature, this imidizing the resin, whereby a polyimide film pattern is formed on the substrate. The conditions of this heating are the same as those in the first aspect of the present invention.

Like the composition according to the first aspect of the invention, the polyamic acid composition according to the second aspect of the invention can be processed into a polyimide film pattern which has a high resolution. In addition, the composition is more photosensitive than the composition according to the first aspect of the invention since it contains a compound which generates an acid when irradiated with a relatively small dose of energy radiation.

The polyamic acid composition according to the third aspect of the present invention will now be described.

The polyamic acid composition according to the third aspect of the invention comprises: at least one component selected from the group consisting of compounds represented by the formulas (1) to (10) and derivatives thereof; and polyamic acid represented by the formula (11). Any of the compounds of the formulas (1) to (10) serves to lower the temperature to imidize the polyamic acid composition.

The polyamic acid having the repeating unit of the formula (11) and the compounds of the formulas (1) to (5) are identical to those used in the first aspect of the present invention and will not, therefore, be described. Polyamic acid having the repeating unit identified by the formula (12) and polyamic acid having the repeating unit represented by the formula (A) may also be used in the composition according to the third aspect of the invention, as in the compositions according to the first and second aspects of the invention. The polyamic acid composition according to the third aspect of the invention may contain, if necessary, a dye, a surfactant, a coupling agent, and an alkali-soluble resin.

The compounds represented by the formulas (6) to (10) will be explained. The compound of the formula (6) is, for example, aminobenzoic acid. The compound of the formula (7) or (8) is, for example, aminophenol. The compound of the formula (9) is, for example, phenolsulfonic acid. The compound of the formula (10) is, for example, hydroxybenzaldehyde. In these compounds, the compound of the formula (9) is particularly preferable because it greatly lowers reaction temperature for imidation. In the compounds of the formulas (6) to (10), the hydroxyl group or amino group may be bonded at any sites of an aromatic ring, such as the ortho site, the meta site and the para site, preferably, the meta or the parasite. The derivatives of the compounds represented by the formulas (6) to (10) are of the type in which each hydrogen atom of the aromatic ring is substituted with hydroxyl group, a halogen atom, cyano group, nitro group, methyl group, ethyl group, ethoxy group or amino group.

In the polyamic acid composition according to the third aspect of the invention, the compounds represented by the formulas (1) to (10) and derivatives thereof should be used in an amount of 0.05 to 3.0 equivalents with respect to the carboxyl groups of the polyamic acid. If the amount of these compounds is less than 0.05 equivalents, the composition will fail to form a polyimide film by means of heat treatment at low temperatures. If the amount of the compounds is greater than 3.0 equivalents, the composition will be unstable in terms of viscosity during storage. Preferably, the amount of these compounds is 0.1 to 2.0 equivalents with respect to the carboxyl groups of the polyamic acid.

The composition according to the third aspect of this invention may contain carboxylic ester or carboxylic amide, either represented by the formula (5). In this case, it does not matter at all even if all or part of the carboxylic ester or the carboxylic amide decomposes into carboxylic acid and tertiary amine.

It will be explained how to process the polyamic acid composition according to the third aspect of the invention, to form a liquid-crystal orientation film of polyimide in a liquid crystal display.

FIG. 1 is a vertical sectional view of a part of the liquid crystal display. As shown in FIG. 1, the display comprises a pair of substrates 1, a common electrode 2 formed on the inner surface of the first substrate, a pixel electrodes 2 formed on the inner surface of the second substrate, a first liquid-crystal orientation film formed on the surface of the common electrode 2, a second liquid-crystal orientation film 3 covering all pixel electrode 2, and a layer of liquid crystal 4 sealed in the gap between the liquid-crystal orientation films 3. Each of the substrates 1 is not restricted to a particular type; it can be of any type which is transparent, such as a glass plate.

First, a common electrode 2 is formed on the inner surface of a substrate 1 by means of CVD (Chemical Vapor Deposition) method using an ordinary transparent electrically conductive material such as tin oxide, indium oxide or ITO. A varnish of the polyamic acid composition according to the third aspect of the invention is coated on the electrode 2 thus formed on the substrate 1. Then, the structure is heated at 60° to 180° C., or at a lower temperature than, for 0.5 to 10 hours, or a period of time as short as, in the case of forming a liquid-crystal orientation film from the conventional polyamic acid composition. The solvent evaporates from the varnish, and the polyamic acid therein is cyclized and changed to polyimide structure. Simultaneously, the compounds of the formulas (1) to (10) and the tertiary amine are removed from the varnish. A polyimide film is thereby formed on the common electrode 2. In most cases it is desirable that the polyimide film, thus formed, have a thickness of about 20 to 200 nm. Thereafter, the polyimide film is rubbed in the ordinary method, thus forming a liquid-crystal orientation film 3. As a result, a first structure comprising the substrate 1, the common electrode 2 and the orientation film 3 is fabricated.

Meanwhile, a second structure comprising a substrate 1, pixel electrodes 2 and a liquid-crystal orientation film 3 is fabricated in the same way as the first structure. The first and second structures are positioned, with the orientation films 3 opposed each other and spaced apart by a predetermined distance. Liquid crystal 4 is injected into the gap between the orientation films 3 and sealed therein by the known means. A liquid crystal display is thereby manufactured.

Since the polyamic acid composition according to the third aspect of the invention can be imidized at a temperature lower than the conventional composition, its use prevent the display performance of the liquid crystal display from being degraded.

The polyamic acid composition according to the fourth aspect of the present invention will now be described.

The polyamic acid composition according to the fourth aspect of the invention comprises: at least one component selected from the group consisting of compounds represented by the formulas (1) to (4) and (6) to (10) and derivatives thereof; polyamic acid represented by the formula (11); and tertiary amine. This polyamic acid composition is identical to the composition according to the third aspect of this invention, except for two respects. First, all compounds of the formulas (1) to (10), but that of the formula (5), are used to lower the temperature to imidize the polyamic acid composition. Second, tertiary amine is used as an indispensable component.

The tertiary amine used in the fourth aspect of the invention is not limited to a specific one. Rather, it may be one represented by the formula (13), trimethylamine, triethylamine, pyridine, prycoline, or the like. These tertiary amines serve to further lower the temperature to imidize the polyamic acid composition, when used together with the compounds of formulas (1) to (4) and (6) to (10).

The tertiary amine is used, preferably in an amount of 0.05 to 3.0 equivalents, more preferably 0.05 to 1.0 equivalent, with respect to the carboxyl groups of the polyamic acid. If the amount of the tertiary amine is less than 0.05 equivalents, the composition will fail to lower the imidation temperature, compared with the imidation temperature of the polyamic acid composition according to the third aspect of the invention is imidized. If the amount of the tertiary amine exceeds than 3.0 equivalents, much tertiary amine will remain in the polyimide film and will mingle into the liquid crystal contacting the film, inevitably degrading the display performance of the liquid crystal display.

Thus, the polyamic acid composition according to the fourth aspect of the invention can form a polyimide film at a lower temperature than the composition according to the third aspect of the present invention.

EXAMPLES

The present invention will be explained in more detail, in conjunction with reference to examples. The examples will be described to facilitate the understanding of the invention, and do not restrict the scope of the present invention.

Synthesis 1: Synthesis of Carboxylic Acid Derivative

Into a nitrogen-substituted, 500 ml reaction flask, 41.4 g (0.30 mol) of 4-hydroxybenzoic acid and 124 g (1.4 mol) of 2-N,N-diemthylaminoethanol were introduced and thoroughly stirred, thereby forming a suspension. Then, to this suspension there was gradually added a solution prepared by dissolving 0.6 g of boron trifluoride-diethyl ether complex in 10 g of 2-N,N-dimethylaminoethanol. Thereafter, the reaction solution was slowly heated and stirred for 6 hours at the reflux temperature of 2-N,N-dimethylaminoethanol. An excessive part of 2-N,N-dimethylaminoethanol was distilled off, and the remaining liquid was distilled under a reduced pressure, thereby obtaining 59 g of intermediate fraction (yield: 87%). The compound thus obtained had infrared absorption spectrum shown in FIG. 2 and $^1$HNMR spectrum shown in FIG. 3. The compound was analyzed, determining its elemental composition shown in Table 1, along with and elemental composition calculated. The spectra of FIGS. 2 and 3 and the data shown in Table 1 identified the compound as 2-N,N-dimethylaminoethyl 4-hydroxybenzoate.

TABLE 1

|  | C | H | N |
|---|---|---|---|
| Calculated Composition (%) | 63.14 | 7.23 | 6.69 |
| Analyzed Composition (%) | 63.51 | 7.09 | 6.37 |

Synthesis 2: Synthesis of Polyamic Acid

Nitrogen gas dried with phosphorus pentaoxide was introduced into a reaction flask having a stirring rod, a thermometer and a dropping funnel. Also introduced into the flask were 12.09 g (0.0375 mol) of 3,3',4,4'-benzophenonetetracarboxylic dianhydride, 2.73 g (0.0125 mol) of pyromellitic dianhydride, and 60 g of N-methyl-2-pyrrolidone. These were fully stirred, forming a mixture. The mixture was cooled to 10° C. Next, 9.41 g (0.047 mol) of 4,4'-diaminodiphenyl ether and 0.75 g (0.003 mol) of 1,3-bis-(γ-aminopropyl)-1,1,3,3-tetramethyldisiloxane were dissolved in 40 g of N-methyl-2-pyrrolidone, thus preparing a solution. The solution was slowly dripped into the reaction flask held at 10° C., thereby forming a liquid mixture. The liquid mixture was stirred for 6 hours at 10° to 15° C., thereby synthesizing polyamic acid. The N-methyl-2-pyrrolidone solution (concentration 0.5 g/dl) of the polyamic acid was examined for its logarithmic viscosity at 30° C., which was found to be 1.2 dl/g.

Synthesis 3: Synthesis of Polyimide

First, 16.11 g (0.05 mol) of 3,3',4,4'-benzophenonetetracarboxylic dianhydride and 50 g of N,N-dimethylacetoamide were poured into a reaction flask of the type used in Synthesis 2. These were sufficiently stirred and mixed. The resultant mixture was cooled to 0° C. Then, 18.31 g (0.05 mol) of 2,2-bis(3-amino-4-hydroxyphenyl)hexafluoropropane was dissolved in 50 g of N,N-dimethylacetoamide, forming a solution. The solution was slowly dripped into the flask held at 0° C., obtaining a liquid mixture. The liquid mixture was stirred for 6 hours at 0° to 10° C., thereby synthesizing polyamic acid. The N-methyl-2-pyrrolidone solution (concentration 0.5 g/dl) of the polyamic acid thus obtained was examined for its logarithmic viscosity at 30° C., which was found to be 0.5 dl/g.

Next, 11.2 g (0.11 mol) of acetic anhydride and 0.2 g (0.025 mol) of pyridine were dissolved in 10 g of N,N-dimethylacetoamide, preparing a solution. The solution was added to the N-methyl-2-pyrrolidone solution of polyamic acid, thus forming a liquid mixture. The liquid mixture was stirred for 18 hours at room temperature, thereby cyclizing the polyamic acid and obtaining a solution. The solution, thus obtained, was poured into a 50 vol % methanol aqueous solution, precipitating polyimide. The polyimide was washed and dried into a solid.

Example 1

2.2 g of 3-hydroxybenzoic acid was added to 20 g of 20 wt % polyamic acid solution obtained in Synthesis 2, forming a liquid mixture. The liquid mixture was fully stirred, forming a homogeneous solution. To this solution there was added a solution prepared by dissolving 0.8 g of a photosensitizer (P-17) represented by the following formula and having an average ester-substitution number of 3, in 4 g of N-methyl-2-pyrrolidone. The resultant liquid mixture was thoroughly stirred, preparing a homogeneous solution. The homogeneous solution was passed through a membrane filter having a pore size of 0.5 μm, thereby preparing a varnish of a polyamic acid composition of the present invention.

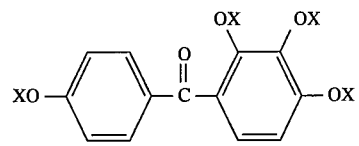

(P-17)

X: 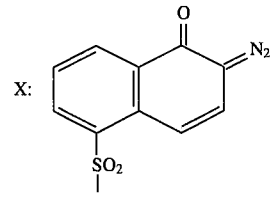

The varnish was spin-coated on a silicon wafer having a diameter of 4 inches. The wafer was placed on a hot plate and heated, and the varnish was thereby dried at 90° C. for 30 minutes, forming a resin layer 4.2 μm thick. Thereafter, the selected parts of the resin layer were exposed to light by means of an exposure apparatus (PLA-501F manufactured by Canon). More precisely, ultraviolet rays (11.0 mW/cm², 405 nm) were applied to the resin layer for 60 seconds through a prescribed mask (amount of light applied 660 mJ/cm²). The resin layer was developed for 75 seconds at room temperature with a 0.595 wt % aqueous solution of tetramethylammonium hydroxide, thereby forming a relief pattern, scarcely eroding the unexposed parts of the resin layer. The relief pattern was fine and clear, comprising lines having a width of 4 μm. The pattern was heat-treated, first at 90° C. for 30 minutes, then at 150° C. for 30 minutes, further at 250° C. for 30 minutes, and finally at 320° C. for 30 minutes, whereby the polyamic acid contained in the resin layer was cyclized and transformed into polyimide. Even after the polyamic acid had been cyclized, the relief pattern remained undamaged, preserving its high resolution of 4 μm.

The above-mentioned varnish of polyamic acid composition was spin-coated on a silicon wafer having a diameter of 3 inches. The wafer was placed on the hot plate and heated, and the varnish was dried at 90° C. for 20 minutes, forming a resin layer 5 μm thick. The resin layer heat-treated, first at 150° C. for 30 minutes, then at 250° C. for 30 minutes, and finally at 320° C. for 30 minutes. The polyamic acid contained in the resin layer was thereby cyclized and transformed into polyimide, forming a polyimide film.

The polyimide film was subjected to peeling test. More specifically, the film was cut with a knife into square pieces, each having a 2×2 mm size. An adhesive cellophane tape was put to the square pieces on the silicon wafer. None of the polyimide pieces peeled from the silicon wafer. Furthermore, the polyimide pieces on the wafer were left in a saturated wafer-vapor atmosphere at 120° C. and 2 atm for 100 hours, and were then put to the same peeling test again. None of the polyimide pieces peeled from the silicon wafer. This proved that the polyimide film was strongly adhered to the silicon wafer.

Example 2

First, 3.3 g of 2-N,N-dimethylaminoethyl 4-hydroxybenzoate obtained in Synthesis 1 was added to 20 g of 20 wt % polyamic acid solution prepared in Synthesis 2. The resultant liquid mixture was thoroughly stirred, thereby forming a homogenous solution. To this solution there was added a solution prepared by dissolving 0.8 g of the above-mentioned photosensitizer (P-17) having an average ester-substitution number of 3 in 4 g of N-methyl-2-pyrrolidone, thus preparing a liquid mixture. This liquid mixture was fully stirred, preparing a homogeneous solution. The homogeneous solution was passed through a membrane filter having a pore size of 0.5 µm, thereby preparing a varnish of a polyamic acid composition of this invention.

The varnish was spin-coated on a silicon wafer having a diameter of 5 inches. The wafer was placed on a hot plate and heated, and the varnish was thereby dried at 90° C. for 20 minutes, forming a resin layer 5.1 µm thick. Thereafter, the selected parts of the resin layer were exposed to light by means of an exposure apparatus (PLA-501F manufactured by Canon). To state precisely, ultraviolet rays (11.0 mW/cm², 405 nm) were applied to the resin layer for 30 seconds through a prescribed mask (amount of light applied is 330 mJ/cm²). The resin layer was developed for 60 seconds with a 0.595 wt % aqueous solution of tetramethylammonium hydroxide, thereby forming a relief pattern, scarcely eroding the unexposed parts of the resin layer. The relief pattern was fine and clear, comprising lines having a width of 4 µm. The pattern was heat-treated, first at 90° C. for 30 minutes, then at 150° C. for 30 minutes, further at 250° C. for 30 minutes, and finally at 320° C. for 30 minutes, whereby the polyamic acid contained in the resin layer was cyclized and transformed into polyimide, thus forming a polyimide film. Even after the polyamic acid had been cyclized, the relief pattern remained undamaged, preserving its high resolution of 4 µm.

The polyimide film formed on the wafer was subjected to the same peeling test as performed in Example 1. The polyimide film did not peel at all from the silicon wafer. Thus it was confirmed that the polyimide film was steadfastly adhered to the silicon wafer.

Example 3

First, 1.5 g of polyimide powder obtained in Synthesis 3 was added to the solution made in Example 2 and consisting of 20 g of 10 wt % polyamic acid solution and 3.3 g of 2-N,N-dimethylaminoethyl 4-hydroxybenzoate. The resultant mixture was fully stirred, thereby forming a homogenous solution. To this solution there was added a solution prepared by dissolving 0.65 g of a photosensitizer (P-22) represented by the following formula and having an average ester-substitution number of 5, in 6 g of N-methyl-2-pyrrolidone. The resultant liquid mixture was thoroughly stirred, preparing a homogeneous solution. The homogeneous solution was passed through a membrane filter having a pore size of 0.5 µm, thereby preparing a varnish of a polyamic acid composition of the present invention.

The varnish was spin-coated on a silicon wafer and dried in the same way as in Example 2, forming a resin layer 5.0 µm thick. Thereafter, the selected parts of the resin layer were irradiated for 30 seconds with ultraviolet rays (11.0 mW/cm², 405 nm) applied through a prescribed mask.

The resin layer, thus exposed to light, was developed for 130 seconds with a developer solution formed of 100 ml of 2.38 wt % aqueous solution of tetramethylammonium hydroxide (trade name AD-10, manufactured by Tama Chemistry Co., Ltd.), 100 ml of water, 2 ml of N-methyl-2-pyrrolidone and 2 g of $(NH_4)_2CO_3$, thereby forming a relief pattern, scarcely eroding the unexposed parts of the resin layer. The relief pattern was fine and clear, comprising lines having a width of 4 µm. Furthermore, a polyimide film was formed on a silicon wafer having a diameter of 3 inches. This film was subjected to the same peeling test as performed in Example 1. The polyimide film did not peel at all from the silicon wafer. Thus it was confirmed that the polyimide film was firmly adhered to the silicon wafer.

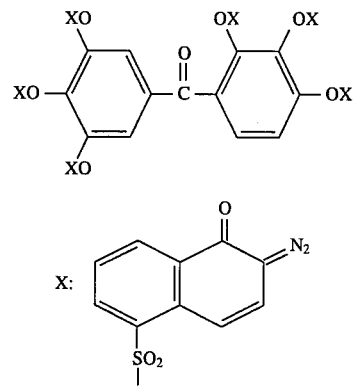

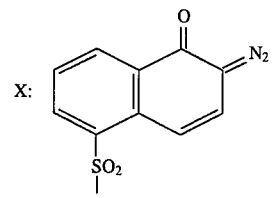

(P-22)

Examples 4 to 9

Five polyamic acids, or Samples 1 to 5 for use in preparing Examples 4 to 9 (i.e., varnishes made of polyamic acid compositions), were synthesized by the method way as in Synthesis 2, each having a material composition specified in Table 2. Also, three polyimides, or Samples 6, 7 and 8, were synthesized in the same manner as in Synthesis 3, each having a material composition shown in Table 3. (Tables 2 and 3 also show the logarithmic viscosity which each N-methyl-2-pyrrolidone solution containing polyamic acid in a concentration of 0.5 g/dl exhibited at 30° C. The solvent used is N-methyl-2-pyrrolidone only.)

Examples 4 to 9, i.e., varnishes each made of a polyamic acid composition, were prepared in the same way as in Examples 1 to 3, each by using a polyamic acid solution (i.e., N-methyl-2-pyrrolidone solution having a polymer concentration of 20 wt %), an aromatic carboxylic acid compound, a polyimide, a photosensitizer, and N-methyl-2-pyrrolidone in the amounts specified in Table 4. The abbreviations in Tables 2 to 4 represent the following compounds:

Tetracarboxylic dianhydrides
PMDA: pyromellitic dianhydride
BTDA: 3,3',4,4'-benzophenonetetracarboxylic dianhydride
6FDA: 2,2-bis(3,4-dicarboxyphenyl)hexafluoro propane dianhydride
DSDA: bis(3,4-dicarboxyphenyl)sulfone dianhydride
Diamines
6FAP: 2,2-bis(3-amino-4-hydroxyphenyl)hexafluoro propane
ODA: 4,4'-diaminediphenyl ether
BAPP: 2,2-bis[4-(4-aminophenoxy)phenyl]propane
BAPH: 2,2-bis[4-(4-aminophenoxy)phenyl]hexapropane
TSL: 1,3-bis(γ-aminopropyl)-1,1,3,3-tetramethyldisiloxane
Carboxylic acid compounds
PEA-1: 2-N,N-dimethylaminoethyl-4-hydroxybenzoate
PEA-2: 2-N,N-dimethylaminoethyl-3-hydroxybenzoate
PEA-3: 2-N,N-dimethylaminoethyl-3-hydroxybenzoic amide
Photosensitizers
P-17: Specified above
P-22: Specified above These varnishes were coated on silicon wafers and processed, thereby forming resin layers, by the method way as in Examples 1 to 3. The resin layers were exposed to light, developed and heat-treated, thereby forming polyimide patterns on the wafers, in the same way as in Examples 1 to 3. The compositions of each varnish, the thickens of each resin layer, the exposure amount, the concentration of the developer solution used, the development time, and the resolution of each pattern obtained were as shown in Table 4. As is evident from Table 4, the polyimide patterns, each having a high resolution, were formed in Examples 4 to 9, too.

The polyamic acid compositions of Examples 4 to 9 were coated on silicon wafers in the same way as in Example 1, thereby forming polyimide films on the silicon wafers. Peeling test was performed on these polyimide films by the same method as in Example 1. None of the polyimide films peeled from the wafers. Next, as in Example 1, the polyimide films were left in a saturated water-vapor atmosphere and then subjected to the peeling test again. The results were that none of the polyimide films peeled from the silicon wafer, proving that the polyimide films were strongly adhered to the silicon wafers.

TABLE 3-continued

| Polyamic acid | | | 6 | 7 | 8 |
|---|---|---|---|---|---|
| | DSDA | g | — | — | 17.9 |
| | | mol | — | — | 0.05 |
| Diamine | 6FAP | g | 18.31 | 18.31 | — |
| | | mol | 0.05 | 0.05 | — |
| | BAPP | g | — | — | 19.3 |
| | | mol | — | — | 0.047 |
| | TSL | g | — | — | 0.74 |
| | | mol | — | — | 0.03 |
| Logarithmic viscosity of polyamic acid (dl/g) | | | 0.51 | 0.72 | 0.48 |

TABLE 2

| Polyamic acid | | | 1 | 2 | 3 | 4 | 5 |
|---|---|---|---|---|---|---|---|
| Tetracarboxylic dianhyride | PMDA | g | 2.73 | — | 2.73 | 2.73 | 2.75 |
| | | mol | 0.0125 | — | 0.0125 | 0.0125 | 0.0125 |
| | BTDA | g | 12.09 | 8.06 | 12.09 | 12.09 | 12.09 |
| | | mol | 0.0375 | 0.025 | 0.0375 | 0.0375 | 0.0375 |
| | 6FDA | g | — | 11.11 | — | — | — |
| | | mol | — | 0.025 | — | — | — |
| Diamine | ODA | g | 6.01 | 6.01 | 9.41 | 6.01 | 9.41 |
| | | mol | 0.03 | 0.03 | 0.047 | 0.03 | 0.047 |
| | BAPP | g | — | 6.98 | — | — | — |
| | | mol | — | 0.017 | — | — | — |
| | BAPH | g | 0.20 | — | — | 8.20 | — |
| | | mol | 0.017 | — | — | 0.017 | — |
| | TSL | g | 0.75 | 0.75 | 0.75 | 0.75 | 0.75 |
| | | mol | 0.003 | 0.003 | 0.003 | 0.003 | 0.003 |
| Logarithmic viscosity (dl/g) | | | 1.5 | 1.2 | 1.2 | 1.5 | 1.2 |

TABLE 3

| Polyamic acid | | | 6 | 7 | 8 |
|---|---|---|---|---|---|
| Tetracarboxylic dianhyride | PMDA | g | 5.45 | 2.73 | — |
| | | mol | 0.025 | 0.0125 | — |
| | BTDA | g | 8.06 | 12.08 | — |
| | | mol | 0.025 | 0.0375 | — |

TABLE 4

| | | Example | | | | | |
|---|---|---|---|---|---|---|---|
| | | 4 | 5 | 6 | 7 | 8 | 9 |
| Composition | Polyamic acid solution (g) | | | | | | |
| of varnish | Sample No. 1 | 20 | | | | | |
| | Sample No. 2 | | 20 | | | | 20 |
| | Sample No. 3 | | | 20 | | | |
| | Sample No. 4 | | | | 20 | | |

TABLE 4-continued

| | | Example | | | | | |
|---|---|---|---|---|---|---|---|
| | | 4 | 5 | 6 | 7 | 8 | 9 |
| | Sample No. 5 Polyimide (g) | | | | | 20 | |
| | Sample No. 6 | | | | 3 | | |
| | Sample No. 7 | | | | | 2 | |
| | Sample No. 8 | | | | | | 2 |
| | Aromatic carboxylic derivative (g) | | | | | | |
| | PEA-1 | 3.4 | | | 3.2 | | |
| | PEA-2 | | 3.4 | | | 3.2 | |
| | PEA-3 | | | 3.4 | | | 3.2 |
| | Photosensitizer (g) | | | | | | |
| | P-17 | 0.8 | | 0.8 | | 0.8 | |
| | P-22 | | 0.8 | | 0.8 | | 0.8 |
| | NMP (g) | 5 | 5 | 5 | 5 | 5 | 5 |
| Photo-sensitivity | Initial film thickness (μm) | 5.4 | 5.4 | 5.6 | 5.3 | 5.3 | 5.4 |
| | Amount of light applied (mJ/cm$^2$) | 350 | 400 | 400 | 350 | 350 | 350 |
| | Resolution (μm) | 4 | 4 | 4 | 4 | 4 | 4 |
| | Concentration of development solution (wt %) | 1.19 | 1.19 | 2.38* | 1.19 | 1.19 | 1.19 |
| | Development time (sec.) | 30 | 42 | 110 | 37 | 50 | 47 |

*1.0 wt % of $(NH_4)_2CO_3$ was added.

Example 10

Polyamic acid, or Sample 9, was synthesized in the same way as in Synthesis 2 by using the materials specified in Table 5. (Table 5 also shows the logarithmic viscosity which the N-methyl-2-pyrrolidone solution containing this polyamic acid in an concentration of 0.5 g/dl exhibited at 30° C. The organic solvent used is N-methyl-2-pyrrolidone only.)

Next, 27.8 g of a solution (18 wt %) of the polyamic acid of Sample 9, 2.0 g of 2-N,N-dimethyl aminoethyl 3-hydroxybenzoate, 1.0 g of tert-butyl naphthalene-2-carboxylate used as dissolution inhibitor, and 0.3 g of triphenylsulfonium hexafluoroantimonate were mixed together, forming a solution. Further, 2 g of N-methyl-2-pyrrolidone was added to the solution, preparing a homogeneous solution. The homogeneous solution was passed through a filter having a pore size of 0.5 μm, thus removing the insoluble substance. As a result, a varnish of a polyamic acid composition of the present invention was prepared.

The varnish was spin-coated on a silicon wafer having a diameter of 4 inches and dried at 90° C. for 20 minutes, forming a resin layer 4 μm thick. Then, the selected parts of the resin layer were exposed to light by means of an exposure apparatus (PLA-501F manufactured by Canon). More precisely, ultraviolet rays (11.5 mw/cm$^2$, 405 nm) were applied to the resin layer for 15 seconds through a mask having a specific pattern. The silicon wafer, thus exposed to light, was immersed for 50 seconds in a 2.38 wt % aqueous solution of tetramethylammonium hydroxide. The wafer was then rinsed with water, thereby forming a pattern. The pattern, thus obtained, was dried. The pattern was cut, and its cross section was observed by a scanning electron microscope. It was ascertained that the unexposed parts of the resin layer were scarcely eroded, and that the pattern comprised lines having a width of 4 μm. Furthermore, a polyimide film was formed on a silicon wafer having a diameter of 3 inches. This film was put to the same peeling test as performed in Example 1. The polyimide film did not peel at all from the silicon wafer. Thus it was confirmed that the polyimide film was firmly adhered to the silicon wafer.

Examples 11 to 19

Polyamic acids, or Samples 10 to 18 for use in preparing Examples 11 to 19, were synthesized by using the materials specified in Table 5. (Table 5 also shows the logarithmic viscosity which the N-methyl-2-pyrrolidone solution containing each polamic acid in an concentraiton of 0.5 g/dl exhibited at 30° C. The organic solvent used is N-methyl-2-pyrrolidone only.)

Examples 11 to 19, i.e., varnishes each made of a polyamic acid composition, were prepared by mixing a 18 wt % solution of polyamic acid, an aromatic carboxylic acid derivative, a dissolution inhibitor, a compound capable of generating an acid when irradiated with light, each component used in the amount specified in Table 6.

The abbreviations in Tables 5 and 6 represent the following compounds:
Tetracarboxylic dianhydride
BPDA: 3,3',4,4'-diphenyltetracarboxylic dianhydride
Diamine
DDS: 4,4'-diaminodiphenylsulfone
Dissolution inhibitor

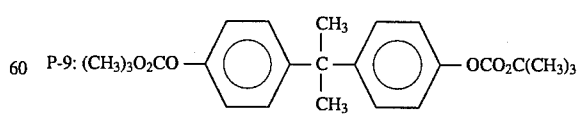

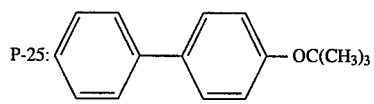

P-28: 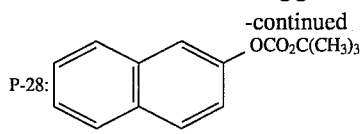

P-32: 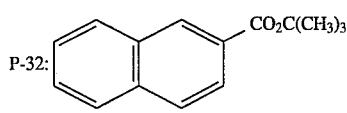

Acid-generating compound

D-1: 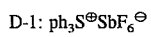

D-2: 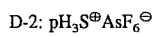

D-3: 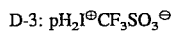

D-4: 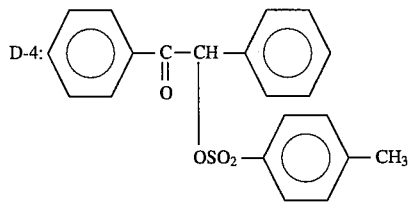

D-5: 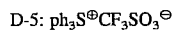

D-6: 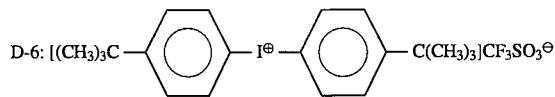

D-7: 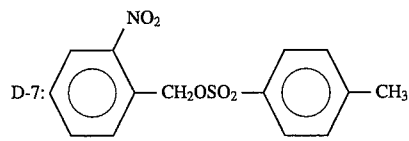

D-8: 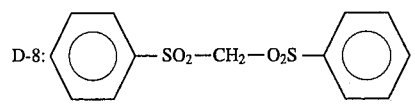

-continued (ph represents 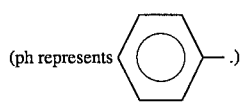.)

These varnishes were coated on silicon wafers and processed, thereby forming resin layers, by the same method as in Examples 1 to 3. The resin layers were exposed to light, developed and heat-treated, thereby forming polyimide patterns on the wafers, in the same way as in Examples 1 to 3. The compositions of each varnish, the thicknesses of each resin layer, the exposure amount, the concentration of the developer solution used, the development time, and the resolution of each pattern obtained were as shown in Table 6. As is evident from Table 6, the polyimide patterns, each having a high resolution, were formed in Examples 11 to 19, too. Further, it was confirmed that the polyamic acid compositions in Table 6 were more sensitive than those in Table 4 from the fact that the exposure amounts in Table 6 were lower than those in Table 4 with respect to the same resolution.

The polyamic acid compositions of Examples 11 to 19 were coated on silicon wafers in the same way as in Example 1, thereby forming polyimide films on the silicon wafers. Peeling test was performed on these films in the same manner as in Example 1. None of the polyimide films peeled from the wafers. Next, as in Example 1, the polyimide films were left in a saturated water-vapor atmosphere and then subjected to the peeling test for the second time. None of the polyimide films peeled from the silicon wafer, proving that the films were steadfastly adhered to the silicon wafers.

TABLE 5

| Polyamic acid | | Sample No. | | | | | | | | | |
|---|---|---|---|---|---|---|---|---|---|---|---|
| | | 9 | 10 | 11 | 12 | 13 | 14 | 15 | 16 | 17 | 18 |
| Tetracarboxylic dianhyride | PDMA(mol) | 0.05 | 1.0 | 0.25 | — | 0.5 | — | — | — | — | — |
| | BTDA(mol) | 0.05 | — | 0.75 | 0.6 | — | — | 1.0 | — | 0.5 | — |
| | BPDA(mol) | — | — | — | 0.4 | — | — | — | 1.0 | — | — |
| | 6FDA(mol) | — | — | — | — | 0.5 | — | — | — | 0.5 | 1.0 |
| | DSDA(mol) | — | — | — | — | — | 1.0 | — | — | — | — |
| Diamine | ODA (mol) | 0.095 | 0.95 | — | — | — | — | — | — | 0.96 | — |
| | TSL (mol) | 0.005 | 0.05 | 0.03 | 0.05 | 0.05 | 0.05 | 0.05 | 0.05 | 0.04 | 0.05 |
| | DDS (mol) | — | — | 0.97 | — | — | — | — | — | — | — |
| | BAPP(mol) | — | — | — | 0.3 | — | 0.95 | 0.95 | — | — | — |
| | 6FAP(mol) | — | — | — | 0.65 | — | — | — | — | — | — |
| | BAPH(mol) | — | — | — | — | 0.95 | — | — | 0.95 | — | 0.95 |
| Logarithmic viscosity (dl/g) | | 1.02 | 1.28 | 0.67 | 0.99 | 0.91 | 0.62 | 0.98 | 1.02 | 1.34 | 0.84 |

TABLE 6

| | | Example | | | | | | | | |
|---|---|---|---|---|---|---|---|---|---|---|
| | | 11 | 12 | 13 | 14 | 15 | 16 | 17 | 18 | 19 |
| Composition | Polyamic acid solution (g) | | | | | | | | | |
| of | Sample No. 10 | 20 | | | | | | | | |
| varnish | Sample No. 11 | | 20 | | | | | | | |
| | Sample No. 12 | | | 20 | | | | | | |
| | Sample No. 13 | | | | 20 | | | | | |
| | Sample No. 14 | | | | | 20 | | | | |
| | Sample No. 15 | | | | | | 20 | | | |
| | Sample No. 16 | | | | | | | 20 | | |
| | Sample No. 17 | | | | | | | | 20 | |
| | Sample No. 18 | | | | | | | | | 20 |
| | Aromatic carboxylic derivative (g) | | | | | | | | | |
| | PEA-1 | 1.5 | 1.6 | 2.0 | 2.0 | | | | | |
| | PEA-2 | | | | | 1.9 | 2.0 | 2.0 | 2.0 | 2.0 |
| | Dissolution inhibitor (g) | | | | | | | | | |
| | P-9 | | | | | | 1.5 | 1.0 | | |
| | P-17 | | | | | | | | | 1.0 |
| | P-25 | | | | 1.5 | 1.5 | | | | |
| | P-28 | | 1.5 | 1.5 | | | | | | |
| | P-32 | 1.0 | | | | | | | 1.5 | |

TABLE 6

| | | Example | | | | | | | | |
|---|---|---|---|---|---|---|---|---|---|---|
| | | 11 | 12 | 13 | 14 | 15 | 16 | 17 | 18 | 19 |
| Composition | Acid generating compound (g) | | | | | | | | | |
| of | D-1 | 0.5 | | | | | | | | |
| varnish | D-2 | | 0.5 | | | | | | | |
| | D-3 | | | 0.5 | | | | | | |
| | D-4 | | | | 0.5 | | | | | |
| | D-5 | | | | | 0.5 | | | | |
| | D-6 | | | | | | 0.5 | | | 0.5 |
| | D-7 | | | | | | | 0.5 | | |
| | D-8 | | | | | | | | 0.5 | |
| | NMP (g) | 2 | 2 | 2 | 2 | 2 | 2 | 2 | 2 | 2 |
| Sensitivity | Initial film thickness (μm) | 4 | 4 | 4 | 4 | 4 | 4 | 4 | 4 | 4 |
| | Amount of light applied (mJ/cm$^2$) | 100 | 90 | 90 | 110 | 110 | 100 | 100 | 130 | 150 |
| | Resolution (μm) | 4 | 4 | 3 | 6 | 6 | 7 | 4 | 4 | 5 |
| | Concentration of development solution (wt %) | 2.38 | 2.38 | 2.38 | 2.38 | 2.38 | 2.38 | 2.38 | 2.38 | 2.38 |
| | Development time (sec.) | 50 | 50 | 50 | 40 | 45 | 45 | 60 | 60 | 60 |

Example 20

29 g of a solution (18 wt %) of the polyamic acid of Sample 17, 1.3 g of 3-hydroxybenzoic acid, 1.1 g of tert-butylnaphthalene-2-carboxylate used as dissolution inhibitor, and 0.32 g of triphenyl sulfonium hexafluoroantimonate used as compound capable of generating an acid when irradiated with light were mixed together, forming a solution. Further, 2 g of N-methyl-2-pyrrolidone was added to the solution, preparing a homogeneous solution. The homogeneous solution was passed through a filter having a pore size of 0.5 μm, thus removing the insoluble substance. As a result, a varnish of a polyamic acid composition of the present invention was prepared.

This varnish was spin-coated on a silicon wafer having a diameter of 4 inches and dried at 90° C. for 30 minutes, forming a resin layer 3.8 μm thick. Then, the selected parts of the resin layer were exposed to light by means of an exposure apparatus (PLA-501F manufactured by Canon). To be more specific, ultraviolet rays (11.5 mW/cm$^2$, 405 nm) were applied to the resin layer for 20 seconds through a mask having a specific pattern. The silicon wafer, thus exposed to light, was immersed for 60 seconds in a 2.38 wt % aqueous solution of tetramethylammonium hydroxide. The wafer was then rinsed with water, thereby forming a pattern. The pattern, thus obtained, was dried. The pattern was cut, and its cross section was observed by a scanning electron microscope. It was confirmed that the unexposed parts of the resin layer were scarcely eroded, and that the pattern comprised lines having a width of 4 μm. Furthermore, a polyimide film was formed on a silicon wafer having a diameter of 3 inches. This film was put to the same peeling test as performed in Example 1. The polyimide film did not peel at all from the silicon wafer. Thus it was confirmed that the polyimide film was firmly adhered to the silicon wafer.

Example 21

6.45 g (0.02 mol) of 3,3',4,4'-benzophenone tetracarboxylic dianhydride and 25 g of N,N-dimethylacetoamide were poured into a reaction flask of the type used in Synthesis 2. These were sufficiently stirred and mixed. The resultant mixture was cooled to 0° C., thus forming a suspension. Then, 7.32 g (0.02 mol) of 2,2-bis(3-amino-4-hydroxyphenyl)hexafluoropropane was dissolved in 30 g of N,N-dimethylacetoamide, forming a solution. The solution was slowly dripped into the flask, obtaining a liquid mixture. The liquid mixture was stirred for 8 hours at 0° to 10° C., thereby obtaining polyamic acid. The N-methyl-2-pyrrolidone solution of the polyamic acid thus obtained was examined for its logarithmic viscosity at 30° C., which was found to be 0.72 dl/g.

Then, 4.5 g of acetic anhydride and 0.5 g of triethylamine were added to the solution. The resultant liquid mixture was stirred at 10° C. for 4 hours. The resultant reaction solution was poured into a liquid mixture consisting of 10 l of methanol an 10 l of water, thus precipitating a polymer. The polymer was filter out, washed with methanol and dried at 100° C. under a reduced pressure, thereby obtaining polyimide.

Next, 2.5 g of the polyimide thus obtained, 14 g of solution of the polyamic acid of Sample 9, 1.7 g of 2-N,N-dimethylaminoethyl 3-hydroxybenzoate, 1.3 g of tert-butyl-naphthalene-2-carboxylate used as dissolution inhibitor, and 0.4 g of triphenylsulfonium hexafluoroantimonate used as compound capable of generating an acid when irradiated with light were mixed together, forming a solution. Further, 12 g of N-dimethylacetoamide was added to the solution, preparing a homogeneous solution. The homogeneous solution was passed through a filter having a pore size of 0.5 μm, thus removing the insoluble substance. As a result, a varnish of a polyamic acid composition of the present invention was prepared. Then, the varnish was coated on a silicon wafer and processed, thereby forming a resin layer, by the same method as in Example 1. The resin layer was exposed to light, developed and heat-treated, thereby forming polyimide patterns on the wafer, in the same manner as in Example 1. As a result, a relief pattern having a width of 4 μm was prepared from the resin layer 4 μm thick.

Furthermore, a polyimide film was formed on a silicon wafer in the same method as in Example 1. The film was subjected to the same peeling test as in Example 1. The polyimide film did not peel from the wafer. Moreover, the polyimide film was left in a saturated water-vapor atmosphere and then subjected to the peeling test again. The polyimide film did not peel from the silicon wafer, proving that it firmly adhered to the silicon wafer.

Example 22

First, 2.18 g (0.01 mol) of pyromellitic dianhydride, and 2.48 g (0.02 mol) of 3-hydroxybenzyl alcohol were added to 10 ml of N-methyl-2-pyrrolidone, thus preparing a liquid mixture. The liquid mixture was stirred for 24 hours at room temperature, thus synthesizing di(3-hydroxybenzyl) pyromellitic ester. Then, 2.00 g (0.01 mol) of 4.4'-diaminodiphenyl ether was dissolved in 10 ml of N-methyl-2-pyrrollidone forming a solution. The solution was added to the above liquid mixture. Further, 4.53 g (0.022 mol) of dicyclohexyl corbodiimide was dissolved in N-methyl-2-pyrrollidone, forming a solution. The solution was added to the above liquid mixture. The liquid mixture was stirred for 7 hours at 5° C. Resultant precipitation was removed by filtration under a reduced pressure. The filtrate, thus obtained, was poured into 600 ml of water, precipitating polyamic acid derivative having a repeating unit represented by the formula (A). The precipitation was recovered by filtration, washed by water and dried into a solid.

Next, 20 g of 20 wt % of polyamic acid solution prepared in Synthesis 2, 2.5 g of polyamic acid derivative prepared above, 3.8 g of 2-N,N-dimethylaminoethyl 3-hydroxybenzoate and 10 g of N-methyl-2-pyrollidone were stirred to mix, thus preparing a homogeneous solution. To this solution there was added a solution prepared by dissolving 1.3 g of a photosensititer (P-17) in 6 g of N-methyl-2-pyrollidone. The resultant liquid mixture was throughly stirred, preparing a homogeneous solution. The homogeneous solution was passed through a membrane filter having a pore size of 0.5 μm, thereby preparing a varnish of a polyamic acid composition of the present invention.

The varnish was spin-coated on a silicon wafer and dried, forming a resin layer. Thereafter, the resin layer was exposed to light and developed in the same way as in Example 2. As a result, the resolution of the pattern obtained was 3 μm. Further, peeling test was performed on a polyimide film formed on a PSG film on a silicon wafer. The polyimide film did not peeled at all fro the silicon wafer, proving that the polyimide film was strongly adhered to the PSG film.

Comparative Example 1

12.09 g (0.0375 mol) of 3,3',4,4'-benzophenone tetracarboxylic dianhydride, 2.73 g (0.0125 mol) of pyromellitic dianhydride, and 60 g of N-methyl-2-pyrrolidone were introduced into a reaction flask of the type used in Synthesis 2. These were sufficiently stirred and mixed. The resultant mixture was cooled to 5° C. Then, 17.22 g (0.047 mol) of 2,2-bis(3-amino-4-hydroxyphenyl)hexafluoropropane and 0.75 g (0.003 mol) of 1,3-bis(γ-aminopropyl)-1,1,3,3-tetramethyldisiloxane were dissolved in a mixture of 20 g of N-methyl-2-pyrrolidone and 20 g of tetrahydrofuran, forming a solution. The solution was dripped over 15 minutes into the flask maintained at 5° C., thus obtaining a liquid mixture. The liquid mixture was stirred for 6 hours at 5° to 15° C., thereby synthesizing polyamic acid. The N-methyl-2-pyrrolidone solution of this polyamic acid had logarithmic viscosity of 0.62 dl/g at 30° C.

Next, 11.2 g (0.11 mol) of acetic anhydride, 0.25 g (0.0025 mol) of triethylamine, and 20 g of N-methyl-2-pyrrolidone were added to the polyamic acid solution. The resultant liquid mixture was stirred for 4 hours at room temperature. The resultant solution was poured into a 50 vol % methanol aqueous solution, thus precipitating polyimide. The polyimide was washed and dried, obtaining solid polyimide.

Next, 5 g of the polyimide thus obtained and 1 g of the photosensitizer (P-17) were dissolved in 20 g of N-methyl-2-pyrrolidone, forming a solution. The solution was passed through a membrane filter having a pore size of 0.5 μm, thereby preparing a photosensitive polyimide varnish.

The varnish was spin-coated on a silicon wafer having a diameter of 5 inches. The wafer was placed on a hot plate heated to 90° C. and was thereby dried for 20 minutes, forming a resin layer 4.9 μm thick. Thereafter, the selected parts of the resin layer were exposed to light by the same exposure apparatus used in Example 1. More precisely, ultraviolet rays (11.0 mW/cm$^2$, 405 nm, dose of 330 mJ/cm$^2$) were applied to the resin layer for 30 seconds through a prescribed mask. The resin layer wafer was developed for 50 seconds with a 1.19 wt % aqueous solution of tetramethylammonium hydroxide, thereby forming a clear relief pattern comprising lines having a width of 5 μm.

Moreover, the same varnish was spin-coated on a silicon wafer having a diameter of 3 inches. The wafer was placed on a hot plate heated to 90° C. and was thereby dried for 20 minutes, forming a resin layer 5 μm thick. This resin layer was heat-treated under a flow of nitrogen gas, first at 150° C. for 30 minutes, then at 250° C. for 30 minutes, and finally at 320° C. for 30 minutes.

Thereafter, the resin layer was subjected to peeling test. To state specifically, the layer was cut with a knife into square pieces, each having a 2×2 mm size. An adhesive cellophane tape was put to the square pieces remaining on the silicon wafer. Seven out of a hundred resin pieces exfoliated from the silicon wafer. Further, the resin layer was left in a saturated watervapor atmosphere at 120° C. and 2 atm for 100 hours, and was then subjected to the peeling test again. All of the resin layer peeled from the silicon wafer.

Example 23

First, 4.92 g (0.0225 mol) of pyromellitic dianhydride, 21.76 g (0.0675 mol) of 3,3',4,4'-benzophenone tetracarboxylic dianhydride, 16.60 g (0.0828 mol) of 4,4'-diaminodiphenyl ether, 1.34 g of (0.0054 mol) of 1,3-bis-(γ-aminopropyl)-1,1,3,3-tetramethyldisiloxane, and 0.82 g (0.0036 mol) of 2-(4-aminophenyl)-2-(4-hydroxyphenyl)propane were made to react with one another in 160 g of N-methyl-2-pyrrolidone, thus obtaining polyamic acid. An N-methyl-2-pyrrolidone solution of this polyamic acid (concentration: 0.5 g/dl) exhibited a logarithmic viscosity of 0.64 dl/g at 30° C. Next, 10 g of the polyamic acid solution (polyamic acid concentration: 22 wt %) and 1.28 g of 2-N,N-dimethylaminoethyl 3-hydroxybenzoate were added to 50 g of N-methyl-2-pyrrolidone. The resultant liquid mixture was thoroughly stirred at room temperature, thus forming a homogeneous solution. The homogeneous solution was passed through a filter having a pore size of 0.2 μm, thus preparing a varnish of a polyamic acid composition. Then, the varnish was coated on a KBr plate and heat-treated at 110° C. for 1 hour, thereby forming a film. From the IR spectrum of this film it was determined that 97% of the polyamic acid had been imidized. A comparative example of a varnish was prepared, by not using 2-N,N-dimethylaminoethyl 3-hydroxybenzoate. The comparative example was heat-treated at 110° C. for 1 hour. The imidation ratio of the comparative example was 0.1%.

The varnish, thus prepared, was screen-printed on glass substrates each having indium oxide electrodes formed on one surface, and was heat-treated at 140° C. for 1 hour. The polyamic acid contained in the varnish was thereby cyclized and transformed into polyimide, thus forming a polyimide film having a thickness of 0.08 μm on each glass substrate. This film was subjected to rubbing performed by a rubbing machine having a roll wrapped with nylon cloth, while rotating the roll at 450 rpm and moving the stage of the machine at 1 cm/sec. Epoxy-based adhesive containing beads was applied on the edges of one surface of one glass substrate having a polyimide film thus rubbed. Two glass substrates were positioned, the their polyimide film surfaces opposing each other and hot-pressed together at 180° C. The beads in the epoxy-based adhesive served as spaces, spacing the substrates apart from each other. The adhesive was thereby cured, bonding the glass substrates together, forming a cell 15 μm thick which had a port. Nematic liquid crystal (ZLI-1565 manufactured by Merk, Inc.) was poured into the cell through the port, and the port was sealed with photo-setting epoxy resin. Two polarizing plates were bonded to the outer surfaces of the glass substrates, respectively, thereby making a liquid crystal display for experimental purpose. This liquid crystal display was tested to determine the initial orientation of the liquid crystal. The liquid crystal exhibited good orientation under any operating condition.

Example 24

1.06 g of 3-hydroxybenzoic acid was added to a 20 g of solution prepared by mixing the polyamic acid of Sample 2 (5 wt %) and N-methyl-2-pyrrolidone. The resultant liquid mixture was thoroughly stirred, forming a homogeneous solution. The homogeneous solution was passed through a filter having a pore size of 0.2 μm, thus preparing a varnish of a polyamic acid composition. The varnish was coated on a KBr plate and heat-treated at 110° C. for 1 hour, thereby forming a film. From the IR spectrum of this film it was found that 89% of the polyamic acid had been imidized. A liquid Crystal display of the same type made in Example 23 was produced for experimental purpose. The liquid crystal display was tested to determine the initial orientation of the liquid crystal. The liquid crystal exhibited good orientation under any operating condition.

Example 25

1.06 g of 3-hydroxybenzoic acid was added to a 20 g of solution prepared by mixing the polyamic acid of Sample 2 (5 wt %) and N-methyl-2-pyrrolidone, forming a liquid mixture. To the liquid mixture there was further added 0.5 g of trimethylamine. The resultant liquid mixture was thoroughly stirred, forming a homogeneous solution. The homogeneous solution was passed through a filter having a pore size of 0.2 μm, thus preparing a varnish of a polyamic acid composition. The varnish was coated on a KBr plate and heat-treated at 110° C. for 1 hour, thereby forming a film. From the IR spectrum of this film it was found that 97% of the polyamic acid had been imidized. A liquid crystal display of the same type made in Example 23 was produced for experimental purpose. The liquid crystal display was tested to determine the initial orientation of the liquid crystal. The liquid crystal exhibited good orientation under any operating condition.

Example 26

Nitrogen gas dried with phosphorus pentaoxide was introduced into a reaction flask having a stirring rod, a thermometer and a dropping funnel. Also introduced into the flask were 19.64 g (0.09 mol) of pyromellitic dianhydride and 80 g of N-methyl-2-pyrrolidone. These were fully stirred and mixed, forming a liquid mixture. The liquid mixture was cooled to 10° C. Then, 16.95 g (0.0846 mol) of 4,4'-diaminodiphenyl ether and 1.34 g (0.054 mol) of 1,3-bis-(γ-aminopropyl)-1,1,3,3-tetramethyl disiloxane were dissolved in 93 g of N-methyl-2-pyrrolidone, thus preparing a solution. The solution was slowly dripped into the reaction flask held at 10° C., thereby forming a liquid mixture. The liquid mixture was stirred for 6 hours at 10° to 15° C., thereby synthesizing polyamic acid of No. 19. The N-methyl-2-pyrrolidone solution (concentration 0.5 g/dl) of the polyamic acid was examined for its logarithmic viscosity at 30° C., which was found to be 0.83 dl/g.

Then, First, 10 g of a solution (polyamic acid concentration: 18 wt %) of the polyamic acid obtained above, and 1.2 g of 4-hydroxyphenyl acetic acid were added to 40 g of N-methyl-2-pyrrolidone. The resultant solution was thoroughly stirred at room temperature, thus forming a homogeneous solution. The homogeneous solution was passed through a filter having a pore size of 0.2 μm, thus preparing a varnish of a polyamic acid composition. The varnish was coated on a KBr plate and heat-treated at 100° C. for 1 hour, thereby forming a film. The film exhibited the IR spectrum illustrated in FIG. 4. From the IR spectrum it was determined that 98% of the polyamic acid had been imidized. Meanwhile, a varnish not containing 4-hydroxyphenyl acetic acid was heat-treated at 100° C. for 1 hour, thereby forming a film. It was found that 0.1% of the polyamic acid in the film had been imidized.

The varnish made of the polyamic acid composition was screen-printed on glass substrates each having ITO electrodes formed on one surface, and was heat-treated at 130° C. for 1 hour. The polyamic acid contained in the varnish was thereby cyclized and transformed into polyimide, thus forming a polyimide film having a thickness of 80 nm on each glass substrate. This film was subjected to rubbing performed by a rubbing machine having a roll wrapped with nylon cloth, while rotating the roll at 450 rpm and moving the stage of the machine at 1 cm/sec. Epoxy-based adhesive containing beads was applied on the edges of one surface of one glass substrate having a polyimide film thus rubbed. Two glass substrates were positioned, the their polyimide film surfaces opposing each other and hot-pressed together at 180° C. The beads in the epoxy-based adhesive served as spaces, spacing the substrates apart from each other. The adhesive was thereby cured, bonding the glass substrates together, forming a cell 15 μm thick which had a port. Nematic liquid crystal (ZLI-1565 manufactured by Merk, Inc.) was injected into the cell through the port, and the port was sealed with photo-setting epoxy resin. Two polarizing plates were bonded to the outer surfaces of the glass substrates, respectively, thereby making a liquid crystal display for experimental purpose. This liquid crystal display was tested to determine the initial orientation of the liquid crystal. The liquid crystal exhibited good orientation.

Examples 27 to 34

Eight polyamic acids, or Samples 19 to 26 were synthesized by the method way as in Example 26, each having a material composition specified in Table 7 or Table 8. (Tables 7 and 8 also show the logarithmic viscosity which each N-methyl-2-pyrrolidone solution containing polyamic acid in a concentration of 0.5 g/dl exhibited at 30° C. The solvent used is N-methyl-2-pyrrolidone only.) The abbreviations in Tables 7 and 8 represent the following compounds:

Tetracarboxylic dianhydrides
BTDA: 3,3',4,4'-benzophenonetetracarboxylic dianhydride
6FDA: 2,2-bis(3,4-dicarboxyphenyl)hexafluoro propane dianhydride
ODPA: 3,3',4,4'-diphenyl ether tracarboxylic dianhydride
BPDA: 3,3',4,4'-diphenyltetracarboxylic dianhydride
Diamines
ODA: 4,4'-diaminodiphenyl ether
PA: p-phenylene diamine
BAPB: 4,4'-bis(4-aminophenoxy)biphenyl
BAPH: 2,2-bis [4-(4-aminophenoxy)phenyl]hexafluoropropane
TSL: 1,3-bis(γ-aminopropyl)-1,1,3,3-tetramethyl disiloxane

TABLE 7

| Polyamic acid | | | Sample No. | | | | |
|---|---|---|---|---|---|---|---|
| | | | 19 | 20 | 21 | 22 | 23 |
| Tetracarboxylic dianhyride | PMDA | g | 19.64 | — | — | — | — |
| | | mol | 0.09 | — | — | — | — |
| | BTDA | g | — | 29.01 | — | — | — |
| | | mol | — | 0.07 | — | — | — |
| | 6FDA | g | — | — | 40.00 | 35.56 | — |
| | | mol | — | — | 0.09 | 0.08 | — |
| | ODPA | g | — | — | — | — | 31.05 |
| | | mol | — | — | — | — | 0.10 |
| | BPDA | g | — | — | — | — | — |
| | | mol | — | — | — | — | — |
| Diamine | ODA | g | 16.95 | 16.96 | 18.05 | — | 20.02 |
| | | mol | 0.0846 | 0.0846 | 0.09 | — | 0.10 |
| | PA | g | — | — | — | 8.33 | — |
| | | mol | — | — | — | 0.0768 | — |
| | BAPB | g | — | — | — | — | — |
| | | mol | — | — | — | — | — |
| | PBPH | g | — | — | — | — | — |
| | | mol | — | — | — | — | — |
| | TSL | g | 1.34 | 1.35 | — | 0.80 | — |
| | | mol | 0.0054 | 0.0054 | — | 0.0032 | — |
| Logarithmic viscosity (dl/g) | | | 0.83 | 0.76 | 1.42 | 0.93 | 1.07 |

TABLE 8

| Polyamic acid | | | Sample No. | | |
|---|---|---|---|---|---|
| | | | 24 | 25 | 26 |
| Tetracarboxylic dianhydride | PMDA | g | 10.91 | 10.92 | — |
| | | mol | 0.05 | 0.05 | — |
| | BTDA | g | — | — | — |
| | | mol | — | — | — |
| | 6FDA | g | — | — | — |
| | | mol | — | — | — |
| | ODPA | g | — | — | — |
| | | mol | — | — | — |

TABLE 8-continued

| Polyamic acid | | | Sample No. | | |
|---|---|---|---|---|---|
| | | | 24 | 25 | 26 |
| | BPDA | g | — | — | 23.57 |
| | | mol | — | — | 0.08 |
| Diamine | ODA | g | — | — | — |
| | | mol | — | — | — | as shown in Table 9. The abbreviations in Table 9 represent the following compounds:

Aromatic compounds
AR-1: 4-hydroxyphenyl acetic acid
AR-2: 4-hydroxybenzoic acid
AR-3: 4-aminophenyl
AR-4: 4-aminobenzoic acid
AR-5: 2-hydroxy-6-naphthoic acid

TABLE 9

| | | Example | | | | | | | | |
|---|---|---|---|---|---|---|---|---|---|---|
| | | 26 | 27 | 28 | 29 | 30 | 31 | 32 | 33 | 34 |
| Composition | Polyamic acid (g) | | | | | | | | | |
| of | Sample No. 19 | 10 | 10 | | | | | | | |
| varnish | Sample No. 20 | | | 10 | | | | | | |
| | Sample No. 21 | | | | 10 | | | | | |
| | Sample No. 22 | | | | | 10 | | | | |
| | Sample No. 23 | | | | | | 10 | | | |
| | Sample No. 24 | | | | | | | 10 | | |
| | Sample No. 25 | | | | | | | | 10 | |
| | Sample No. 26 | | | | | | | | | 10 |
| | Aromatic compound (g) | | | | | | | | | |
| | AR-1 | 1.2 | 0.7 | | | | 1.1 | 1.3 | | 1.1 |
| | AR-2 | | | 1.2 | | | | | | |
| | AR-3 | | | | | | | | 1.2 | |
| | AR-4 | | | | 1.5 | | | | | |
| | AR-5 | | | | | 1.5 | | | | |
| | NMP (g) | 40 | 40 | 40 | 40 | 40 | 40 | 40 | 40 | 40 |
| Heat-treatment time (60 min) | | 100 | 110 | 110 | 110 | 110 | 110 | 110 | 110 | 100 |
| Imidation ratio (%) | | 98 | 91 | 89 | 92 | 85 | 89 | 93 | 88 | 94 |
| Initial crystal orientation | | o | o | — | — | — | o | — | o | o |
| Reliability | | — | o | — | — | — | o | — | o | o | o: good
—: not measured

TABLE 8-continued

| Polyamic acid | | | Sample No. | | |
|---|---|---|---|---|---|
| | | | 24 | 25 | 26 |
| | PA | g | — | — | 8.65 |
| | | mol | — | — | 0.08 |
| | BAPB | g | 17.70 | — | — |
| | | mol | 0.048 | — | — |
| | PBPH | g | — | 24.89 | — |
| | | mol | — | 0.048 | — |
| | TSL | g | 0.50 | 0.50 | — |
| | | mol | 0.002 | 0.002 | — |
| Logarithmic viscosity of polyamic acid (dl/g) | | | 0.77 | 1.16 | 0.97 |

Varnishes each made of a polyamic acid composition, were prepared in the same way as in Example 26, each by using a polyamic acid solution, an aromatic compound represented below and N-methyl-2-pyrrolidone in the amounts specified in Table 9. Table 9 also shows imidation temperature and imidation ratio of the vanish of each polyamic acid composition. A part of varnishes of Examples 27 to 34 were used, making liquid crystal displays in the same method as in Example 26. These displays were tested for their initial orientation. Further, they are left to stand in an atmosphere at temperature of 70° C. and relative humidity of 90%, for 100 hours, and were then tested for their orientation (i.e., reliability). The results of these tests were Furthermore, the polyamic acid solution of Sample 19 was spin-coated on a silicon waver having 4 inches, forming a resin layer 5 μm thick. The resin layer was dried at 90° C. for 60 minutes and heat-treated at 150° C. for 60 minutes and further at 300° C. for 60 minutes, thereby forming a polyimide film (A), which exhibited an imidation ratio of 98%.

Meanwhile, 2.4 g of 4-hydroxyphenyl acetic acid was added to 20 g of the polyamic acid solution (polyamic acid concentration: 18 wt %), forming a liquid mixture. The liquid mixture was fully stirred, thus forming a homogeneous solution. The homogeneous solution was passed through a filter having a pore size of 0.5 μm, thus removing the insoluble substance. Then, the solution was coated on a silicon waver having a diameter of 4 inches, forming a film 5 μm thick. The film was heat-treated at 90° C. for 60 minutes and further at 110° C. for 60 minutes, thereby forming a polyimide film (B) having a imidation ratio of 99%.

Thereafter, the polyimide film was subjected to peeling test. More precisely, the film was cut with a knife into square pieces, each having a 2×2 mm size. An adhesive cellophane tape was put to the square pieces remaining on the silicon wafer. None of the square pieces of the film (A) exfoliated from the silicon wafer. Nor did the square pieces of the film (B). The silicon wafers, one coated with the polyimide film (A) and the other coated with the polyimide film (B), were left in a saturated water-vapor atmosphere at 120° C. and 2 atm for 100 hours, and was then subjected to the peeling test again. It was found that thirty-two out of 100 pieces of the film (A) exfoliated from the resin layer peeled from the silicon wafer, and that none of the pieces of the film (B) peeled from the silicon wafer.

Example 35

22.212 g (0.05 mol) of 2,2-bis(3,4-dicarboxypheyl-)hexafluoropropane dianhydride was slowly added over 15 minutes to a solution maintained at 10° C. and consisting of 14.708 g (0.044 mol) of 2,2-bis(4-aminophenyl)hexafluoropropane, 1.491 g (0.06 mol) of 1,3-bis(γ-aminopropyl)-1,1,3,3-tetramethyldisiloxane and 170 g of N-methyl-2-pyrrolidone. The resultant liquid mixture was stirred for 7 hours at 10° to 15° C., thereby synthesizing polyamic acid. The polyamic acid had logarithmic viscosity of 0.84 dl/g. Next, 10 g of the polyamic acid solution, 0.85 g of 4-phenolsulfonic acid, and 10 g of N-methyl-2-pyrrolidone were mixed, forming a liquid mixture. The liquid mixture was stirred, forming a homogeneous solution. The solution was passed through a filter having a pore size of 0.2 μm, thus preparing a varnish. The varnish was coated on a KBr plate and heat-treated at 100° C. for 1.5 hour, thereby forming a film. The film was analyzed for its IR spectrum. From the IR spectrum it it was determined that the 91% of polyamic acid had been imidized. A liquid crystal display was made for experimental purpose, by using the varnish, in the same method as in Example 26. The display was tested for its initial orientation. The liquid crystal exhibited good orientation under any operating condition.

Example 36

First, 10 g of the polyamic acid solution obtained in Example 35, 0.6 g of 4-hydroxybenzialdehyde, 0.4 g of triethylamine, and 10 g of N-methyl-2-pyrrolidone were mixed, forming a liquid mixture. The mixture was stirred, forming a homogeneous solution. The solution was passed through a filter having a pore size of 0.2 μm, thus preparing a varnish. Next, the varnish was examined in the same way as in Example 35, for the imidation ratio of the polyamic acid. The imidation ratio was 92%. A liquid crystal display was made, by using the varnish, in the same method as in Example 35. The display was tested for its initial orientation, and the liquid crystal exhibited good orientation under any operating condition.

What is claimed is:

1. A polyamic acid composition in admixture comprising:

at least one component selected from the group consisting of compounds represented by the following formulas (1) to (5) and derivatives thereof:

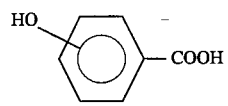 (1)

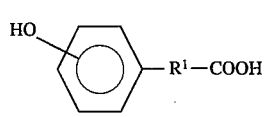 (2)

($R^1$ is an alkylene group having 1 to 10 carbon atoms, ethynylene group or —$CH_2CO$—);

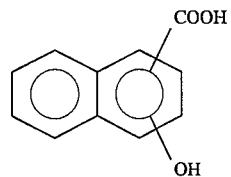 (3)

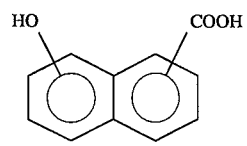 (4)

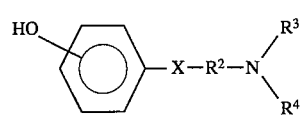 (5)

where X is —C(=O)—O— or —C(=O)—NH—, $R^2$ is an alkylene group having 1 to 4 carbon atoms, and $R^3$ and $R^4$ are each a methyl group or an ethyl group; and wherein said derivatives of formulas (1) to (5) are obtained by substituting at least one hydrogen of the aromatic ring with a radical selected from the group consisting of hydroxyl group, carboxyl group, halogen atom, cyano group, nitro group, methyl group, ethyl group, methoxy group and amino group; polyamic acid represented by the following formula (11):

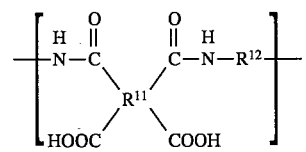 (11)

where $R^{11}$ is a tetravalent organic group, and $R^{12}$ is a divalent organic group;

a dissolution inhibitor; and a compound capable of generating an acid when irradiated with light, and wherein said component represented by formulas (1) to (5) is present in an amount of 0.05 to 3.0 equivalents with respect to the carboxyl groups of the polyamic acid, and wherein said dissolution inhibitor is present in an amount of 1 to 60 wt % of said polyamic acid, wherein said acid generating compound is present in an amount of 0.01 to 20 wt % of the amount of said polyamic acid, and wherein said polyamic acid is a polyimide precursor.

2. The polyamic acid composition according to claim 1, wherein said polyamic acid has a logarithmic viscosity of 0.10 dl/g or more, when measured in N-methyl-2-pyrrolidone solution at 30° C., with the polymer concentration set at 0.5 g/dl.

3. The polyamic acid composition according to claim 1, wherein said dissolution inhibitor is at least one selected from the group consisting of a diazide compound, aromatic compound having a tert-butyl group or trimethylsilyl group, and phenyl benzoate.

4. The polyamic acid composition according to claim 1, wherein said compound capable of generating an acid when irradiated with light is at least one selected from the group consisting of an onium salt, an organic halogen compound, and naphthoquinonediazide-4-sulfonate.

5. The polyamic acid composition according to claim 1, further comprising polyimide represented by the following formula (12):

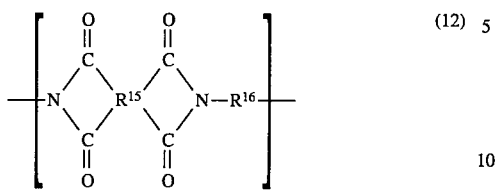

(12)

where $R^{15}$ is a tetravalent organic group and $R^{16}$ is a divalent organic group.

6. The polyamic acid composition according to claim 5, wherein said polyimide is used in an amount of 80 wt % or less of a total amount of said polyamic acid and said polyimide.

7. A polyamic acid composition consisting essentially of:

at least one component selected from the group consisting of compounds represented by the following formulas (1) to (10) and derivatives thereof:

(1)

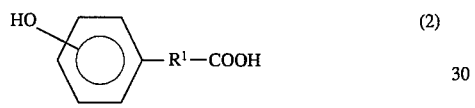

(2)

where $R^1$ is an alkylene group having 1 to 10 carbon atoms, ethynylene group or —CH$_2$CO—;

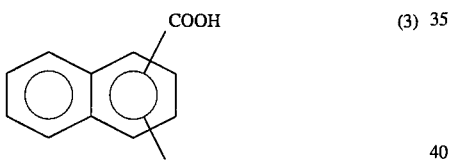

(3)

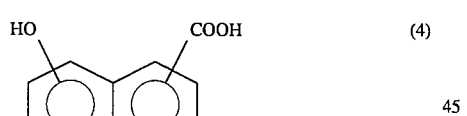

(4)

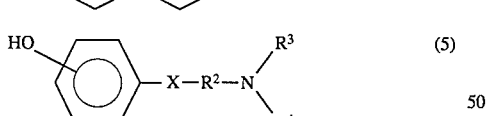

(5)

where X is —C(=O)—O— or —C(=O)—NH—, $R^2$ is an alkylene group having 1 to 4 carbon atoms, and $R^3$ and $R^4$ are each a methyl group or an ethyl group; and wherein said derivatives of formulas (1) to (5) are obtained by substituting at least one hydrogen of the aromatic ring with a radical selected from the group consisting of hydroxyl group, carboxyl group, halogen atom, cyano group, nitro group, methyl group, ethyl group, methoxy group and amino group;

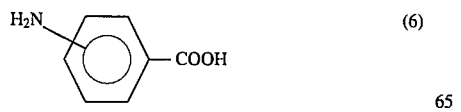

(6)

-continued

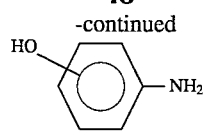

(7)

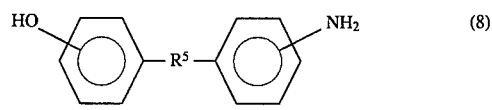

(8)

where $R^5$ is a direct bond, —O—, —SO$_2$—, —CH$_2$—, —C(CH$_3$)$_2$— or —C(CF$_3$)$_2$—;

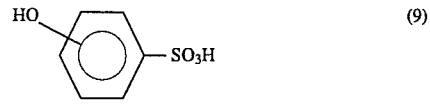

(9)

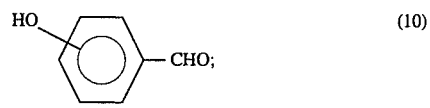

(10)

and and wherein said derivatives of formulas (6) to (10) are obtained by substituting at least one hydrogen of the aromatic ring with a radical selected from the group consisting of hydroxyl group, carboxyl group, halogen atom, cyano group, nitro group, methyl group, ethyl group, methoxy group and amino group;

polyamic acid represented by the following formula (11):

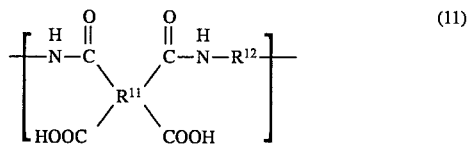

(11)

where $R^{11}$ is a tetravalent organic group, and $R^{12}$ is a divalent organic group, wherein said component represented by formulas (1) to (10) and derivatives thereof is present in an amount of 0.05 to 3.0 equivalents with respect to the carboxyl groups of the polyamic acid, and wherein said polyamic acid is polyimide precursor.

8. A polyamic acid composition consisting essentially of:

at least one component selected from the group consisting of compounds represented by the following formulas (1) to (4) and (6) to (10) and derivatives thereof:

(1)

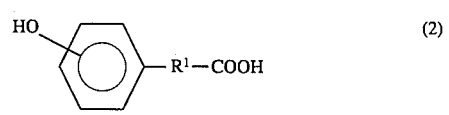

(2)

where $R^1$ is an alkylene group having 1 to 10 carbon atoms, ethynylene group or —CH$_2$CO—;

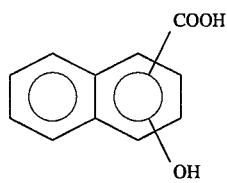

(3)

(4)

(6)

(7)

(8)

where R⁵ is a direct bond, —O—, —SO₂—, —CH₂—, —C(CH₃)₂— or —C(CF₃)₂—;

(9)

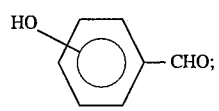

(10)

and polyamic acid represented by the following formula (11):

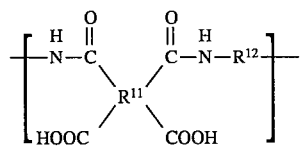

(11)

where $R^{11}$ is a tetravalent organic group, and $R^{12}$ is a divalent organic group; and
tertiary amine, and
wherein said component represented by formulas (1) to (4) and (6) to (10) is present in an amount of 0.05 to 3.0 equivalents with respect to the carboxyl groups of the polyamic acid,
wherein said tertiary amine is present in an amount of 0.05 to 3.0 equivalents with respect to the carboxyl groups of the polyamic acid, and
wherein said polyamic acid is a polyimide precursor.

\* \* \* \* \*